(12) United States Patent
Ohmori

(10) Patent No.: US 8,159,865 B2
(45) Date of Patent: Apr. 17, 2012

(54) INFORMATION STORAGE ELEMENT AND METHOD OF WRITING/READING INFORMATION INTO/FROM INFORMATION STORAGE ELEMENT

(75) Inventor: Hiroyuki Ohmori, Kanagawa (JP)

(73) Assignee: Sony Corporation, Tokyo (JP)

( * ) Notice: Subject to any disclaimer, the term of this patent is extended or adjusted under 35 U.S.C. 154(b) by 394 days.

(21) Appl. No.: 12/585,868

(22) Filed: Sep. 28, 2009

(65) Prior Publication Data

US 2010/0097848 A1 Apr. 22, 2010

(30) Foreign Application Priority Data

Oct. 16, 2008 (JP) ................................. 2008-267222

(51) Int. Cl.
*G11C 11/00* (2006.01)
(52) U.S. Cl. ........................................................ 365/158
(58) Field of Classification Search .................... 365/158
See application file for complete search history.

(56) References Cited

U.S. PATENT DOCUMENTS

| 7,969,762 | B2 * | 6/2011 | Cros et al. ........................ | 365/80 |
| 2008/0165576 | A1 * | 7/2008 | Deligianni et al. ............ | 365/171 |

FOREIGN PATENT DOCUMENTS

| JP | 2005-123617 A | 5/2005 |
| JP | 2006-073930 A | 3/2006 |
| JP | 2006-237183 A | 9/2006 |
| JP | 2007-324171 A | 12/2007 |

OTHER PUBLICATIONS

Japanese Office Action issued Aug. 31, 2010 for corresponding Japanese Application No. 2008-267222.

* cited by examiner

*Primary Examiner* — Huan Hoang
*Assistant Examiner* — Anthan Tran
(74) *Attorney, Agent, or Firm* — Rader, Fishman & Grauer PLLC

(57) ABSTRACT

In a method of writing information into and reading information from an information storage element which includes a strip-shaped ferromagnetic material layer, a first electrode disposed at an end of the ferromagnetic material layer, a second electrode disposed at another end of the ferromagnetic material layer, and an antiferromagnetic region composed of an antiferromagnetic material and disposed in contact with at least a part of the ferromagnetic material layer, the method includes the steps of applying a current between the first electrode and the second electrode to cause a current-induced domain wall motion; in the ferromagnetic material layer, writing a magnetization state into a magnetization region as information or reading a magnetization state from a magnetization region as information; and eliminating or decreasing exchange coupling between the ferromagnetic material layer and the antiferromagnetic region at the time of the motion of a domain wall.

18 Claims, 15 Drawing Sheets

[STEP-100]

[STEP-110]

[STEP-120]

[STEP-130]

[STEP-200]

[STEP-200] (CONTINUATION)

[STEP-210]

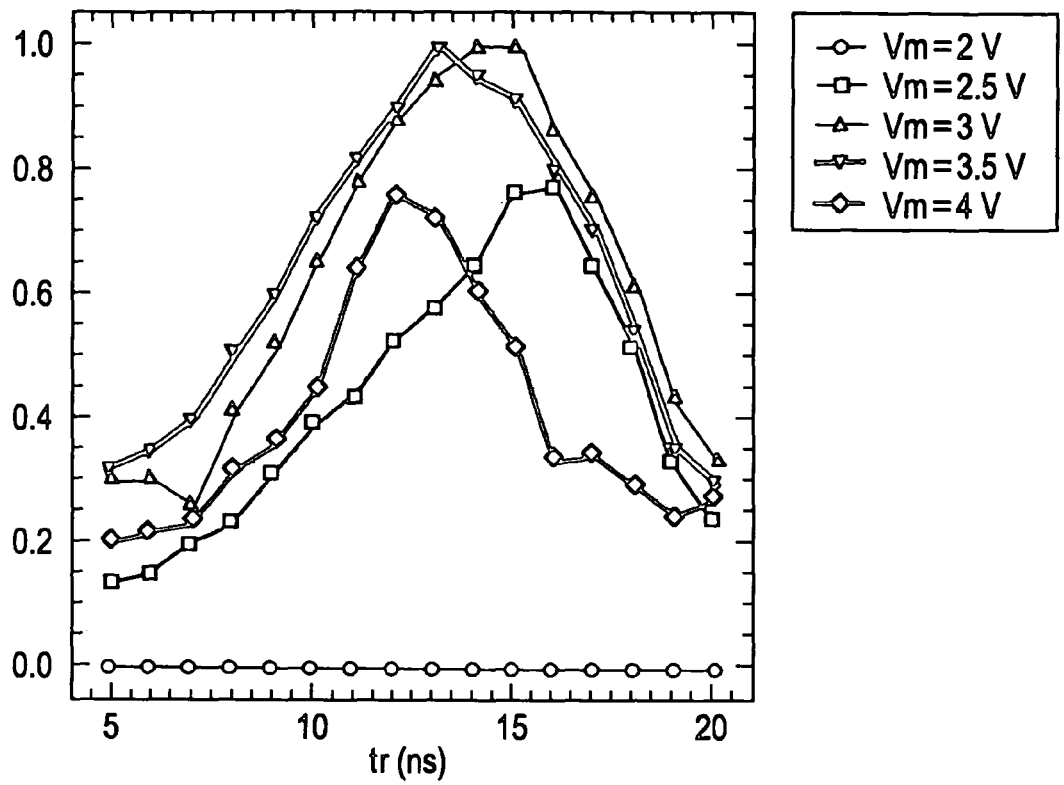
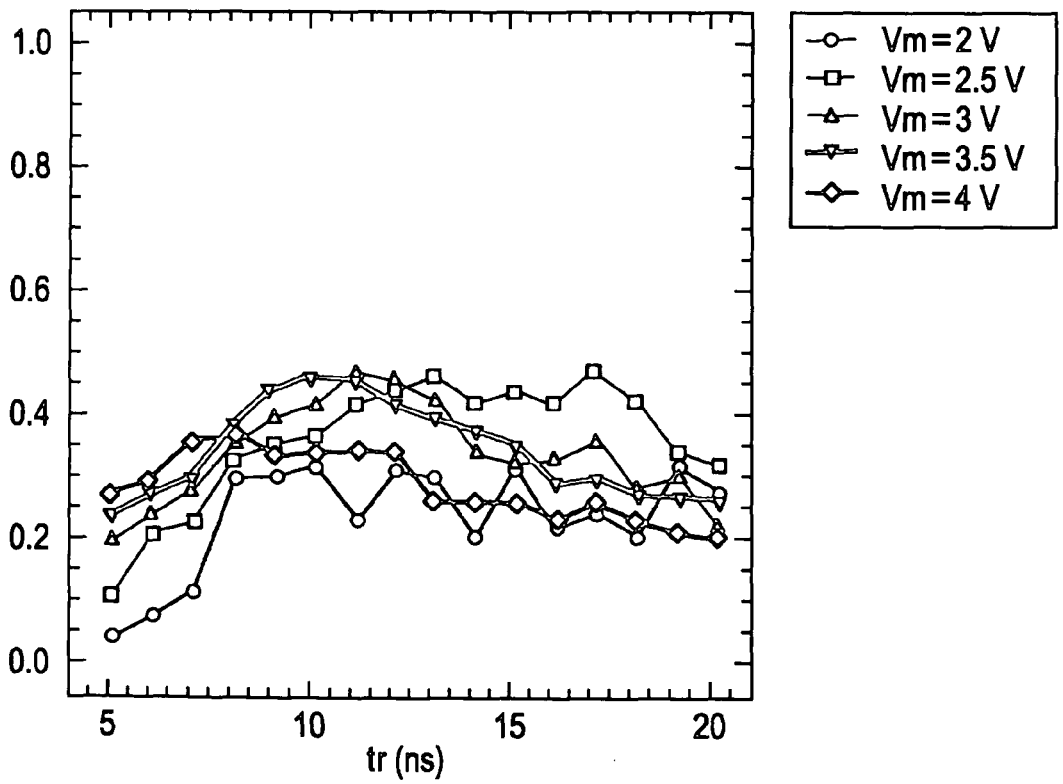

INFORMATION STORAGE ELEMENT AND METHOD OF WRITING/READING INFORMATION INTO/FROM INFORMATION STORAGE ELEMENT

BACKGROUND OF THE INVENTION

1. Field of the Invention

The present invention relates to an information storage element and a method of writing information into and reading information from the information storage element.

2. Description of the Related Art

In information devices such as computers, currently, a hard disk drive is widely used as an external storage unit. However, since a hard disk drive includes a rotation mechanism, it is difficult to reduce the size thereof and to save electric power. Consequently, a silicon disk drive (solid-state drive (SSD)) including a flash memory has started to be used as an external storage unit for a small device. However, such a silicon disk drive is expensive and the storage capacity thereof is not sufficient. Therefore, a storage unit which has a large storage capacity, which is non-volatile, and into and from which information can be written and read at a high speed has been strongly desired.

As one of such storage units, a current-induced domain wall motion magnetic memory, which is a memory developed from a magnetic memory configured to store information as a magnetization state of a magnetic material, has been devised (refer to, for example, Japanese Unexamined Patent Application Publication Nos. 2005-123617 and 2006-237183). In such a current-induced domain wall motion magnetic memory, a strip-shaped ferromagnetic material layer is divided into a plurality of magnetization regions (magnetic domains), and a current is applied to the ferromagnetic material layer, whereby information is written into or read from the magnetization regions of the ferromagnetic material layer while moving a domain wall, which is a boundary of the magnetization regions.

SUMMARY OF THE INVENTION

Such a current-induced domain wall motion magnetic memory still has a problem in terms of holding of information and a stable motion of a domain wall. In order to easily move a domain wall, the thickness of the ferromagnetic material layer may be reduced or a soft magnetic material may be used as the ferromagnetic material layer. However, such a solution is contrary to stable holding of information. Furthermore, when domain walls are moved a long distance in the ferromagnetic material layer, the distance between domain walls may vary, and thus information errors may readily occur.

Accordingly, it is desirable to provide an information storage element including a domain wall motion magnetic memory in which a stable domain wall motion can be realized and writing, holding, and reading of information can be reliably performed, and a method of writing information into and reading information from the information storage element.

According to an embodiment of the present invention, there is provided a method of writing information into and reading information from an information storage element which includes a strip-shaped ferromagnetic material layer (ferromagnetic recording layer), a first electrode disposed at an end of the ferromagnetic material layer, a second electrode disposed at another end of the ferromagnetic material layer, and an antiferromagnetic region composed of an antiferromagnetic material and disposed in contact with at least a part of the ferromagnetic material layer, the method including the steps of applying a current between the first electrode and the second electrode to cause a current-induced domain wall motion; in the ferromagnetic material layer, writing a magnetization state into a magnetization region as information or reading a magnetization state from a magnetization region as information; and eliminating or decreasing exchange coupling between the ferromagnetic material layer and the antiferromagnetic region at the time of the motion of a domain wall.

According to an embodiment of the present invention, there is provided an information storage element including a strip-shaped ferromagnetic material layer (ferromagnetic recording layer); a first electrode disposed at an end of the ferromagnetic material layer; a second electrode disposed at another end of the ferromagnetic material layer; and an antiferromagnetic region composed of an antiferromagnetic material and disposed in contact with at least a part of the ferromagnetic material layer, wherein a current-induced domain wall motion is caused by applying a current between the first electrode and the second electrode, and in the ferromagnetic material layer, a magnetization state is written into a magnetization region as information or a magnetization state is read from a magnetization region as information.

In the method of writing information into and reading information from an information storage element according to an embodiment of the present invention or the information storage element according to an embodiment of the present invention, a magnetization state is written into a magnetization region as information. A method of writing such information depends on the configuration and structure of a third electrode, but examples of the method includes a method in which information is written by spin-injection magnetization reversal due to an application of a current on the basis of a giant magnetoresistance (GMR) effect or a tunnel magnetoresistance (TMR) effect and a method in which information is written on the basis of a magnetic field generated by a current. The magnetization state is read as information. Examples of a method of reading such information include a method of detecting the level of an electrical resistance value in a ferromagnetic material layer and a method of detecting a direction of a magnetic field in a ferromagnetic material layer. At the time of a motion of a domain wall, which is a boundary (interface) between magnetization regions, specifically, immediately before the start of the motion of the domain wall, at the same time of the start of the motion, or during the motion, in order to eliminate or decrease exchange coupling between the ferromagnetic material layer and an antiferromagnetic region, the temperature of the ferromagnetic material layer and/or the antiferromagnetic region is increased.

In the information storage element according to an embodiment of the present invention and the method of writing information into and reading information from the information storage element according to an embodiment of the present invention, any of the following measures is fundamentally taken:

[A] A variation of an increase in the temperature of a ferromagnetic material layer (ferromagnetic recording layer) is generated in a direction of the axis of the ferromagnetic material layer.

[B] A blocking temperature TB in antiferromagnetic regions is varied in a direction of the axis of a ferromagnetic material layer.

[C] Antiferromagnetic regions are periodically arranged.

At room temperature, the magnetization direction of the ferromagnetic material layer is fixed by the antiferromagnetic region, and thus information (a magnetization state in a magnetization region) can be reliably held for a long time. In addition, in writing or reading information, exchange coupling between the ferromagnetic material layer and the antiferromagnetic region is eliminated or decreased. As a result, a domain wall can be easily moved. Accordingly, even when the domain wall is moved a long distance in the ferromagnetic material layer, the occurrence of a problem that information errors readily occur can be reliably prevented. Consequently, according to an embodiment of the present invention, writing, recording, and reading of information can be reliably performed while stably holding information and a large amount of information can be recorded in a single continuous magnetic element. Accordingly, a compact, lightweight, and inexpensive information storage unit can be realized.

BRIEF DESCRIPTION OF THE DRAWINGS

FIG. 9A is a graph showing a domain wall reproduction ratio when a voltage $+V_m$ was applied to a first electrode of the information storage element of Example 2 with a period Of $t_r$;

FIG. 9B is a graph showing a domain wall reproduction ratio when a voltage $+V_m$ was applied to a first electrode of an information storage element of a comparative example with a period of $t_r$;

DESCRIPTION OF THE PREFERRED EMBODIMENTS

Figure 1A:
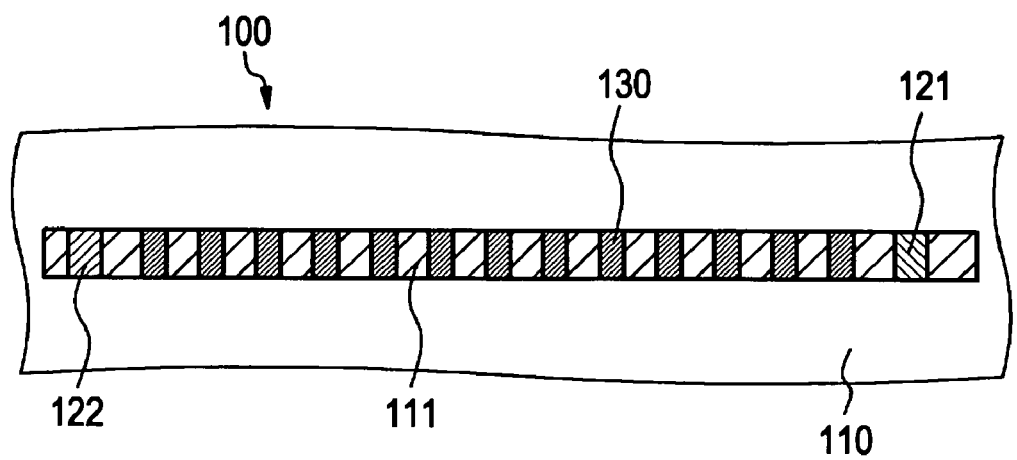
FIG. 1A is a schematic partial plan view of an information storage element of Example 1.

The present invention will now be described with reference to the drawings on the basis of Examples.

[Overall description about information storage elements according to embodiments of the present invention and methods of writing information into and reading information from the information storage elements according to embodiments of the present invention]

In a method of writing information into and reading information from the information storage element according to an embodiment of the present invention, exchange coupling between a ferromagnetic material layer and an antiferromagnetic region may be eliminated or decreased by Joule heat generated by applying a current between a first electrode and a second electrode.

In the method of writing information into and reading information from the information storage element according to an embodiment of the present invention, a plurality of antiferromagnetic regions may be arranged with a space therebetween. In this case, when the number of bits of information to be stored is represented by N, the number of antiferromagnetic regions may be N or more. For the sake of convenience, this configuration may be referred to as "a first method of writing and reading information". The length of each of the antiferromagnetic regions that are arranged with a space therebetween in a direction of the axis of the ferromagnetic material layer, and the distance between adjacent antiferromagnetic regions can be appropriately determined in accordance with a specification of the information storage element. The above description also applies to a first information storage element described below.

In the method of writing information into and reading information from the information storage element according to an embodiment of the present invention, a plurality of antiferromagnetic regions may be arranged, and an upper limit temperature at which a magnetization state in a magnetization region can be fixed (so-called a blocking temperature TB at which exchange coupling between a ferromagnetic material layer and an antiferromagnetic region that is in contact with the ferromagnetic material layer is eliminated) may vary between the antiferromagnetic regions. In this case, when the number of bits of information to be stored is represented by N, the number of antiferromagnetic regions having a high upper-limit temperature may be N or more. For the sake of convenience, this configuration may be referred to as "a second method of writing and reading information". In order to vary the upper limit temperature at which a magnetization state in a magnetization region can be fixed, the composition or the structure of antiferromagnetic regions is varied. The temperature of the ferromagnetic material layer and the antiferromagnetic regions is represented by $T_0$. In the case where the blocking temperature TB of an antiferromagnetic region is higher than the temperature $T_0$, exchange coupling between the antiferromagnetic region and a portion of the ferromagnetic material layer that is in contact with the antiferromagnetic region is not eliminated. On the other hand, in the case where the blocking temperature TB of an antiferromagnetic region is lower than the temperature $T_0$, exchange coupling between the antiferromagnetic region and a portion of the ferromagnetic material layer that is in contact with the antiferromagnetic regions is eliminated. Accordingly, by varying the blocking temperature TB in the antiferromagnetic regions, an elimination state or decreasing state of the exchange coupling between each of the antiferromagnetic regions and the ferromagnetic material layer can be controlled in accordance with the temperature of the antiferromagnetic regions and the ferromagnetic material layer. The antiferromagnetic regions having different upper limit temperatures at which a magnetization state in a magnetization region can be fixed may be divided into at least two groups. Antiferromagnetic regions having a high upper-limit temperature and antiferromagnetic regions having a low upper-limit temperature may be alternately arranged. The length of each of the antiferromagnetic regions having the high upper-limit temperature in a direction of the axis of the ferromagnetic material layer may be appropriately determined in accordance with the specification of the information storage element. The antiferromagnetic regions may be formed over the entire surface of a portion of the ferromagnetic material layer where information is to be recorded. In order to vary the composition of the antiferromagnetic regions, for example, nitrogen ions or oxygen ions may be implanted in the antiferromagnetic regions. In order to vary the structure of the antiferromagnetic regions, for example, the thickness of the antiferromagnetic regions may be varied. The above description also applies to a second information storage element described below.

In the method of writing information into and reading information from the information storage element according to an embodiment of the present invention, the cross-sectional area of the ferromagnetic material layer when the ferromagnetic material layer is cut along a virtual plane orthogonal to a direction of the axis of the ferromagnetic material layer may vary in the direction of the axis of the ferromagnetic material layer. In this case, regions of the ferromagnetic material layer having a large cross-sectional area and regions of the ferromagnetic material layer having a small cross-sectional area, the cross-sectional areas being obtained when the ferromagnetic material layer is cut along a virtual plane orthogonal to a direction of the axis of the ferromagnetic material layer, may be alternately provided in the direction of the axis of the ferromagnetic material layer. Furthermore, when the number of bits of information to be stored is represented by N, the number of regions of the ferromagnetic material layer having the large cross-sectional area may be N or more. For the sake of convenience, this configuration may be referred to as "a third method of writing and reading information". A variation or a difference in the size of the cross-sectional area can be obtained by setting the width of the ferromagnetic material layer, setting the thickness of the ferromagnetic material layer, or setting the width and the thickness of the ferromagnetic material layer. By varying the cross-sectional area of the ferromagnetic material layer in the direction of the axis of the ferromagnetic material layer as described above, when a current is applied to the ferromagnetic material layer, a variation of an increase in the temperature of the ferromagnetic material layer (ferromagnetic recording layer) can be generated in the direction of the axis of the ferromagnetic material layer. Regions of the ferromagnetic material layer having different cross-sectional areas may be divided into at least two groups. The lengths of the regions of the ferromagnetic material layer having different cross-sectional areas in the direction of the axis of the ferromagnetic material layer may be appropriately determined in accordance with the specification of the information storage element. The antiferromagnetic region may be formed over the entire surface of a portion of the ferromagnetic material layer where information is to be recorded. Alternatively, a plurality of antiferromagnetic regions may be arranged with a space therebetween. The above description also applies to a third information storage element described below.

In the method of writing information into and reading information from the information storage element according to an embodiment of the present invention, a specific resistance value of the ferromagnetic material layer may vary in a direction of the axis of the ferromagnetic material layer. In this case, regions of the ferromagnetic material layer having a high specific resistance value and regions of the ferromagnetic material layer having a low specific resistance value may be alternately provided in the direction of the axis of the ferromagnetic material layer. Furthermore, when the number of bits of information to be stored is represented by N, the number of regions of the ferromagnetic material layer having the low specific resistance value may be N or more. For the sake of convenience, this configuration may be referred to as "a fourth method of writing and reading information". The specific resistance value can be varied by, for example, implanting nitrogen ions or oxygen ions into desired portions or regions of the ferromagnetic material layer. Similarly, by varying the specific resistance value of the ferromagnetic material layer in the direction of the axis of the ferromagnetic material layer as described above, when a current is applied to the ferromagnetic material layer, a variation of an increase in the temperature of the ferromagnetic material layer (ferromagnetic recording layer) can be generated in the direction of the axis of the ferromagnetic material layer. Regions of the ferromagnetic material layer having different specific resistance values may be divided into at least two groups. The lengths of the regions of the ferromagnetic material layer having different specific resistance values in the direction of the axis of the ferromagnetic material layer may be appropriately determined in accordance with the specification of the information storage element. The antiferromagnetic region may be formed over the entire surface of a portion of the ferromagnetic material layer where information is to be recorded. Alternatively, a plurality of antiferromagnetic regions may be arranged with a space therebetween. The above description also applies to a fourth information storage element described below.

In the method of writing information into and reading information from the information storage element according to an embodiment of the present invention, the information storage element may further include a temperature control device configured to change the temperature of the ferromagnetic material layer in a direction of the axis of the ferromagnetic material layer, the temperature control device being disposed near the ferromagnetic material layer. For the sake of convenience, this configuration may be referred to as "a fifth method of writing and reading information". By providing the temperature control device as described above and optionally controlling the temperature control device, a variation of an increase in the temperature of the ferromagnetic material layer (ferromagnetic recording layer) can be generated in the direction of the axis of the ferromagnetic material layer. In this case, the temperature control device may be provided so that regions of the ferromagnetic material layer at a high temperature and regions of the ferromagnetic material layer at a low temperature are alternately formed in the direction of the axis of the ferromagnetic material layer, and the temperature control device may be optionally controlled. Furthermore, the temperature control device may be provided so that when the number of bits of information to be stored is represented by N, the number of regions of the ferromagnetic material layer at the low temperature is N or more, and the temperature control device may be optionally controlled. As described above, the temperature of the ferromagnetic material layer is varied in the direction of the axis of the ferromagnetic material layer. The regions of the ferromagnetic material layer having different temperatures may be divided into at least two groups. The lengths of the regions of the ferromagnetic material layer having different temperatures in the direction of the axis of the ferromagnetic material layer may be appropriately determined in accordance with the specification of the information storage element. The antiferromagnetic region may be formed over the entire surface of a portion of the ferromagnetic material layer where information is to be recorded. Alternatively, a plurality of antiferromagnetic regions may be arranged with a space therebetween. The above description also applies to a fifth information storage element described below.

An example of the temperature control device is a heater configured to heat the ferromagnetic material layer and the antiferromagnetic region. Such a heater may be disposed near the ferromagnetic material layer and the antiferromagnetic region. The heater can be constituted by, for example, a patterned high-resistor layer. Examples of the material constituting the high-resistor layer include carbon-based resistor materials such as silicon carbide (SiC) and silicon carbide nitride (SiCN), silicon nitride (SiN)-based materials, semiconductor resistor materials such as amorphous silicon, refractory metal oxides such as ruthenium dioxide ($RuO_2$), tantalum oxide, chromium oxide, and titanium oxide, and refractory metal nitrides such as tantalum nitride. Alternatively, heat conduction around the ferromagnetic material layer may be changed. That is, the thermal conductivity of a region surrounding the ferromagnetic material layer may be changed. Specifically, for example, a heat sink may be provided. In such an embodiment, the heat sink corresponds to the temperature control device. The above description also applies to embodiments below.

In the method of writing information into and reading information from the information storage element according to an embodiment of the present invention, the information storage element may further include a third electrode disposed in contact with a part of the ferromagnetic material layer, the third electrode including a non-magnetic film that is in contact with the part of the ferromagnetic material layer and a magnetization reference layer (also referred to as a "pinned layer" or "magnetization-pinned layer") disposed on the non-magnetic film, and a magnetization state may be written into each magnetization region as information by applying a current between the second electrode and the third electrode. In this case, an electrical resistance value in each magnetization region may be read from the third electrode as information by applying a current between the second electrode and the third electrode. The second electrode and the third electrode may be disposed so as to face each other, with the ferromagnetic material layer therebetween. The second electrode and the third electrode may be disposed at the same side of the ferromagnetic material layer or different sides of the ferromagnetic material layer. The above description also applies to embodiments below.

In the method of writing information into and reading information from the information storage element according to an embodiment of the present invention, the information storage element may further include a magnetic field generation/detection device adjacent to a part of the ferromagnetic material layer, and a magnetization state may be written into each magnetization region as information by applying a current to the magnetic field generation/detection device. In this case, a magnetic field generated in each magnetization region may be read as information by the magnetic field generation/detection device. Specific examples of the magnetic field generation/detection device include a coil and wiring that generate a magnetic field. By applying a current to the magnetic field generation/detection device, a magnetization state is written as information into each magnetization region. Specifically, a magnetic field is generated by applying a current to a coil or wiring, and the magnetization state may be aligned in magnetization regions by the magnetic field in a desired direction. Also, the direction of the magnetic field generated in each magnetization region may be read as information by the coil or the wiring functioning as the magnetic field generation/detection device. Alternatively, as a method of reading information, a method using a photomagnetic effect (Kerr effect) may be employed. The above description also applies to embodiments below.

Furthermore, in the method of writing information into and reading information from the information storage element according to an embodiment of the present invention, preferably, the current applied to the ferromagnetic material layer in order to cause a current-induced domain wall motion is regularly modulated. In this case, the speed of the motion of a domain wall can be kept constant, and elimination or a change in the magnetized information during writing or reading of information can be more reliably suppressed.

An information storage element according to an embodiment of the present invention may further include a third electrode disposed in contact with a part of the ferromagnetic material layer, the third electrode including a non-magnetic film that is in contact with the part of the ferromagnetic material layer and a magnetization reference layer disposed on the non-magnetic film, in which a magnetization state may be written into each magnetization region as information by applying a current between the second electrode and the third electrode. In this case, an electrical resistance value in each magnetization region may be read from the third electrode as information by applying a current between the second electrode and the third electrode.

An information storage element according to an embodiment of the present invention may further include a magnetic field generation/detection device adjacent to a part of the ferromagnetic material layer, wherein a magnetization state may be written into each magnetization region as information by applying a current to the magnetic field generation/detection device. In this case, a magnetic field generated in each magnetization region may be read as information by the magnetic field generation/detection device.

In the information storage element according to an embodiment of the present invention, a plurality of antiferromagnetic regions may be arranged with a space therebetween. Furthermore, when the number of bits of information to be stored is represented by N, the number of antiferromagnetic regions may be N or more. For the sake of convenience, this configuration may be referred to as "a first information storage element".

In the information storage element according to an embodiment of the present invention, a plurality of antiferromagnetic regions may be arranged, and an upper limit temperature (blocking temperature BT) at which a magnetization state in a magnetization region can be fixed may vary between the antiferromagnetic regions. In this case, when the number of bits of information to be stored is represented by N, the number of antiferromagnetic regions having a high upper-limit temperature may be N or more. For the sake of convenience, this configuration may be referred to as "a second information storage element".

In the information storage element according to an embodiment of the present invention, the cross-sectional area of the ferromagnetic material layer when the ferromagnetic material layer is cut along a virtual plane orthogonal to a direction of the axis of the ferromagnetic material layer may vary in the direction of the axis of the ferromagnetic material layer. In this case, regions of the ferromagnetic material layer having a large cross-sectional area and regions of the ferromagnetic material layer having a small cross-sectional area, the cross-sectional areas being obtained when the ferromagnetic material layer is cut along a virtual plane orthogonal to a direction of the axis of the ferromagnetic material layer, may be alternately provided in the direction of the axis of the ferromagnetic material layer. Furthermore, when the number of bits of information to be stored is represented by N, the number of regions of the ferromagnetic material layer having the large cross-sectional area may be N or more. For the sake of convenience, this configuration may be referred to as "a third information storage element".

In the information storage element according to an embodiment of the present invention, a specific resistance value of the ferromagnetic material layer may vary in a direction of the axis of the ferromagnetic material layer. In this case, regions of the ferromagnetic material layer having a high specific resistance value and regions of the ferromagnetic material layer having a low specific resistance value may be alternately provided in the direction of the axis of the ferromagnetic material layer. Furthermore, when the number of bits of information to be stored is represented by N, the number of regions of the ferromagnetic material layer having the low specific resistance value may be N or more. For the sake of convenience, this configuration may be referred to as "a fourth information storage element".

The information storage element according to an embodiment of the present invention may further include a temperature control device configured to change the temperature of the ferromagnetic material layer in a direction of the axis of the ferromagnetic material layer, the temperature control device being disposed near the ferromagnetic material layer. For the sake of convenience, this configuration may be referred to as "a fifth information storage element".

It is sufficient that the planar shape of the ferromagnetic material layer may be a strip (stripe) shape. The planar shape of the ferromagnetic material layer may be linear or curved. The ferromagnetic material layer may have a three-dimensional shape such as a "U-character" shape, or a branched shape such as a "Y-character" shape.

The magnetization direction of the ferromagnetic material layer (ferromagnetic recording layer) is fixed by magnetic exchange coupling between the ferromagnetic material layer (ferromagnetic recording layer) and the antiferromagnetic region. That is, the ferromagnetic material layer is pinned by exchange coupling with the antiferromagnetic region. As a material constituting such a ferromagnetic material layer (ferromagnetic recording layer), a material having a high spin-torque efficiency is preferably used in order to move a domain wall with a small current. Specific examples thereof include ferromagnetic materials such as nickel (Ni), iron (Fe), and cobalt (Co); alloys of these ferromagnetic materials (such as Co—Fe, Co—Fe—Ni, and Ni—Fe); alloys (such as Co—Fe—B) in which a non-magnetic element (such as tantalum, boron, chromium, platinum, silicon, carbon, nitrogen, aluminum, phosphorus, niobium, or zirconium) is mixed with any of the above alloys of ferromagnetic materials; oxides containing at least one of Co, Fe, and Ni (such as ferrite:Fe—MnO); a group of intermetallic compounds (Heusler alloys such as NiMnSb, $Co_2MnGe$, $Co_2MnSi$, and $Co_2CrAl$) called half-metallic ferromagnetic materials; and oxides (such as $(La,Sr)MnO_3$, $CrO_2$, and $Fe_3O_4$). The crystallinity of the ferromagnetic material layer is optional, and the ferromagnetic material layer may be composed of polycrystals or a single crystal, or may be amorphous. The ferromagnetic material layer may have a single-layer structure, a stacked layer structure in which a plurality of different ferromagnetic material layers are stacked, or a stacked layer structure in which a ferromagnetic material layer and a non-magnetic material layer are stacked.

Examples of the material constituting the antiferromagnetic region include iron-manganese alloys, nickel-manganese alloys, platinum-manganese alloys, iridium-manganese alloys, rhodium-manganese alloys, cobalt oxides, and nickel oxides. In order to efficiently supply the ferromagnetic material layer with a current, oxides containing iron (Fe), cobalt (Co), or nickel (Ni), which has a high electrical resistance, are more suitably used.

The antiferromagnetic region may be formed so as to be in contact with part of the ferromagnetic material layer or may be formed over the entire surface of the ferromagnetic material layer. By adopting the former configuration, the above-mentioned item [C] can be achieved. On the other hand, in the case where the latter configuration is adopted, the configuration and the structure of the antiferromagnetic region and the ferromagnetic material layer should be optimized so as to achieve the above-mentioned item [A] or [B].

The ferromagnetic material layer and the antiferromagnetic region can be formed by a physical vapor deposition (PVD) method such as a sputtering method, an ion-beam deposition method, or a vacuum deposition method or a chemical vapor deposition (CVD) method such as an atomic layer deposition (ALD) method. Patterning of the ferromagnetic material layer and the antiferromagnetic region can be performed by a reactive ion etching (RIE) method or an ion milling method (ion-beam etching method).

Each of the first electrode and the second electrode may have a single-layer structure composed of, for example, Cu, Au, Pt, or Ti or a stacked structure including an underlying layer composed of, for example, Cr or Ti and a Cu layer, a Au layer, a Pt layer or the like disposed on the underlying layer. Alternatively, each of the first electrode and the second electrode may have a single-layer structure composed of, for example, W, Ru, or Ta or a stacked structure including a W, Ru, or Ta layer and a Cu, Cr, or Ti layer. These electrodes can be formed by, for example, a PVD method such as a sputtering method.

The third electrode and the ferromagnetic material layer constitute an information recoding structure having a TMR effect or a GMR effect. Here, the information recoding structure having the TMR effect and constituted by a magnetization reference layer, a non-magnetic film, and the ferromagnetic material layer refers to a structure in which the non-magnetic film functioning as a tunnel insulating film is sandwiched between the magnetization reference layer and the ferromagnetic material layer. Examples of the material of the magnetization reference layer included in the third electrode include the above-mentioned materials constituting the ferromagnetic material layer. The magnetization reference layer may have a configuration having a stacked ferri-structure (stacked structure having an antiferromagnetic coupling and also referred to as a synthetic antiferromagnet (SAF)) or a configuration having a magnetostatic coupling structure. The stacked ferri-structure is a structure which has, for example, a three-layer structure of magnetic material layer/ ruthenium (Ru) layer/magnetic material layer (specifically, for example, a three-layer structure of CoFe/Ru/CoFe or a three-layer structure of CoFeB/Ru/CoFeB) and in which interlayer exchange coupling between the two magnetic material layers becomes antiferromagnetic or ferromagnetic depending on the thickness of the ruthenium layer. Such a structure has been reported in, for example, S. S. Parkin et al., Physical Review Letters, 7 May, pp. 2304-2307 (1990). A structure in which the interlayer exchange coupling between the two magnetic material layers becomes antiferromagnetic is referred to as "stacked ferri-structure". On the other hand, a structure in which antiferromagnetic coupling is obtained by a leakage magnetic field from an end face of the two magnetic material layers is referred to as "magnetostatic coupling structure". Examples of the material of the non-magnetic film included in the third electrode include insulating materials such as magnesium oxide (MgO), magnesium nitride, aluminum oxides ($AlO_x$), aluminum nitride (AlN), silicon oxide, silicon nitride, $TiO_2$, $Cr_2O_3$, Ge, NiO, $CdO_x$, $HfO_2$, $Ta_2O_5$, BN, and ZnS. On the other hand, examples of the material of the non-magnetic film constituting an information recoding structure having a GMR effect include electrically conductive materials such as Cu, Ru, Cr, Au, Ag, Pt, and Ta and alloys thereof. The non-magnetic film may be composed of any non-metallic material as long as the material has a high electrical conductivity (a resistivity of several hundred $\mu\Omega\cdot cm$ or less). However, preferably, a material that does not readily cause an interface reaction with the ferromagnetic material layer or the magnetization reference layer is appropriately selected as the material of the non-magnetic film.

The non-magnetic film composed of an insulating material is obtained by, for example, oxidizing or nitriding a metal film formed by a sputtering method. More specifically, in the case where an aluminum oxide ($AlO_x$) or magnesium oxide (MgO) is used as the insulating material constituting the non-magnetic film, examples of the method of forming the non-magnetic film include a method of oxidizing in the atmosphere aluminum or magnesium deposited by a sputtering method, a method of plasma-oxidizing aluminum or magnesium deposited by a sputtering method, a method of oxidizing by ICP plasma aluminum or magnesium deposited by a sputtering method, a method of naturally oxidizing in oxygen aluminum or magnesium deposited by a sputtering method, a method of oxidizing with oxygen radicals aluminum or magnesium deposited by a sputtering method, a method of naturally oxidizing aluminum or magnesium in oxygen while irradiating ultraviolet rays, the aluminum or magnesium being deposited by a sputtering method, a method of depositing aluminum or magnesium by a reactive sputtering method, and a method of depositing an aluminum oxide ($AlO_x$) or magnesium oxide (MgO) by a sputtering method.

The above description is summarized as follows. In order to generate a temperature variation of the ferromagnetic material layer (ferromagnetic recording layer) in a direction of the axis of the ferromagnetic material layer, any of the following measures can be taken.

[1] The cross-sectional area (width and/or thickness) of the ferromagnetic material layer (ferromagnetic recording layer) may be changed.

[2] A specific resistance value of the ferromagnetic material layer (ferromagnetic recording layer) may be changed by, for example, ion-implanting an impurity into the ferromagnetic material layer (ferromagnetic recording layer).

[3] A temperature control device may be disposed near the ferromagnetic material layer.

[4] Heat conduction around the ferromagnetic material layer may be changed.

By generating a temperature variation as described above, elimination or a decrease in exchange coupling between the ferromagnetic material layer and antiferromagnetic regions can be controlled in each antiferromagnetic region.

[5] Alternatively, instead of generating a temperature variation, by arranging a plurality of antiferromagnetic regions with a space therebetween, the exchange coupling between the ferromagnetic material layer and the antiferromagnetic regions can also be controlled.

[6] Furthermore, instead of generating a temperature variation, by varying the blocking temperature by changing the composition or the structure of the antiferromagnetic regions, elimination or a decrease in the exchange coupling between the ferromagnetic material layer and the antiferromagnetic regions can be controlled in each antiferromagnetic region.

EXAMPLE 1

Example 1 relates to an information storage element according to an embodiment of the present invention and a method of writing information into and reading information from the information storage element according to an embodiment of the present invention. More specifically, Example 1 relates to the first information storage element and the first method of writing and reading information.

Figure 1B:
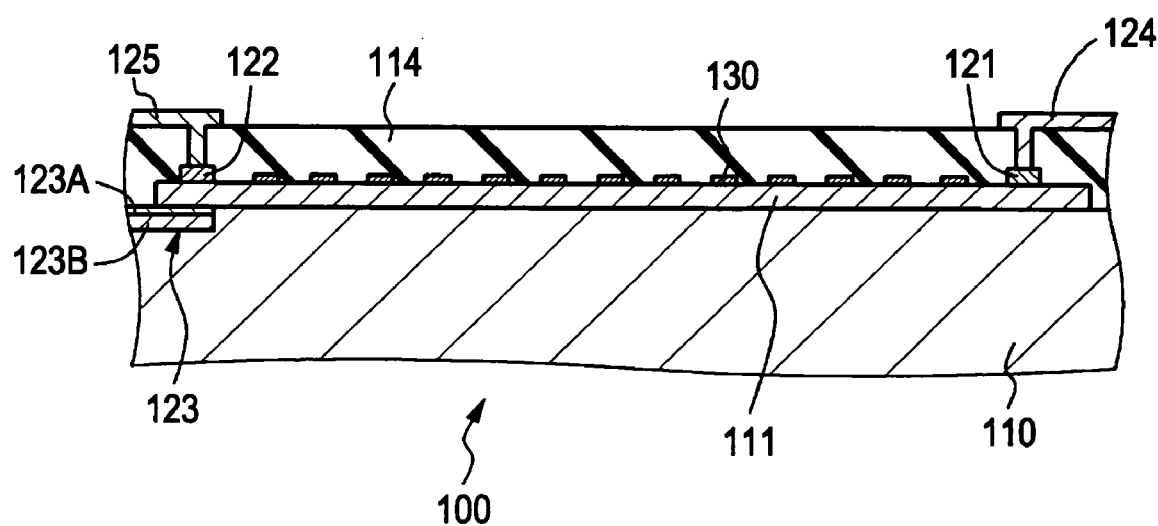
FIG. 1B is a schematic partial cross-sectional view of the information storage element of Example 1.

FIG. 1A is a schematic partial plan view of an information storage element of Example 1, and FIG. 1B is a schematic partial cross-sectional view of the information storage element. As shown in FIGS. 1A and 1B, an information storage element 100 of Example 1 includes a strip-shaped ferromagnetic material layer (ferromagnetic recording layer) 111. A first electrode 121 is provided at an end of the ferromagnetic material layer 111, and a second electrode 122 is provided at another end of the ferromagnetic material layer 111. In the information storage element 100 of Example 1, a current-induced domain wall motion due to a spin torque generated by applying a current between the first electrode 121 and the second electrode 122 occurs. The current applied between the first electrode 121 and the second electrode 122 is referred to as "domain wall-moving current". In the ferromagnetic material layer 111, a magnetization state is written as information into a magnetization region 112 or a magnetization state is read as information from the magnetization region 112. Furthermore, a plurality of antiferromagnetic regions 130 composed of an antiferromagnetic material are provided so as to be in contact with at least part of the ferromagnetic material layer 111. Reference numeral 113 indicates a domain wall which is a boundary (interface) between magnetization regions 112. An easy magnetization axis of the ferromagnetic material layer 111 is parallel to the axis of the ferromagnetic material layer 111. In FIG. 1A, an interlayer insulating layer 114 is omitted. Reference numerals 124 and 125 indicate wirings formed on the interlayer insulating layer 114 and connected to the first electrode 121 and the second electrode 122, respectively. In the information storage element 100 shown in FIGS. 1A and 1B, the first electrode 121 and the second electrode 122 are provided on the upper part of the ferromagnetic material layer 111, and a third electrode 123 is provided on the lower part of the ferromagnetic material layer 111. Contrary to this, the first electrode 121 and the second electrode 122 may be provided on the lower part of the ferromagnetic material layer 111, and the third electrode 123 may be provided on the upper part of the ferromagnetic material layer 111.

In the information storage element 100 of Example 1, the antiferromagnetic regions 130 are arranged with a space therebetween. Furthermore, when the number of bits of information to be stored is represented by N (for example, N=16 in Example 1), the number of antiferromagnetic regions 130 is N or more (specifically, N=16 in Example 1). That is, the measure of item [C] described above is taken in Example 1.

The information storage element 100 of Example 1 further includes the third electrode 123 provided in contact with a part of the ferromagnetic material layer 111. The third electrode 123 is disposed so as to face the second electrode 122 with the ferromagnetic material layer 111 therebetween. The third electrode 123 includes a non-magnetic film 123A that is in contact with the part of the ferromagnetic material layer 111 and a magnetization reference layer 123B disposed on the non-magnetic film 123A (under the non-magnetic film 123A in the state shown in the figure). The magnetization reference layer 123B functions as a standard magnetization layer for determining a direction of magnetization to be recorded in the magnetization regions 112. By applying a current between the second electrode 122 and the third electrode 123, a magnetization state is written into each magnetization region 112. Also, by applying a current between the second electrode 122 and the third electrode 123, an electrical resistance value (level of the electrical resistance value) in each magnetization region 112 is read from the third electrode 123 as information. The third electrode 123 and the ferromagnetic material layer 111 constitute an information recoding structure having a GMR effect. Magnetization regions 112 are formed by a spin-injection magnetization reversal due to a current to form a domain wall 113, thus writing information into the ferromagnetic material layer 111. Specifically, in the ferromagnetic material layer 111, the magnetization direction thereof is changed to a direction parallel or antiparallel to the magnetization direction of the magnetization reference layer 123B in accordance with the direction in which the current flows.

In Example 1, the ferromagnetic material layer 111 is composed of a linear-shaped Ni—Fe alloy layer having a thickness of 3 nm and a width of 1 μm, and each of the antiferromagnetic regions 130 is composed of a NiO layer having a thickness of 0.2 μm. The non-magnetic film 123A included in the third electrode 123 is composed of a Cu layer having a thickness of 1 nm. The magnetization reference layer 123B included in the third electrode 123 is composed of a stacked film of CoFe:1 nm/Ru:0.8 nm/CoFe:1 nm/PtMn:30 nm/Ta:5 nm. Each of the first electrode 121 and the second electrode 122 is composed of a titanium layer. For example, the first electrode 121 is connected to a driving power supply (not shown), and the second electrode 122 is connected to the ground. The third electrode 123 and the ferromagnetic material layer 111 may constitute an information recoding structure having a TMR effect. In such a case, the non-magnetic film 123A may be composed of, for example, MgO.

A method of writing information into and reading information from the information storage element of Example 1 will now be described with reference to FIGS. 2A to 2F and FIGS. 3A to 3E, all of which are conceptual views of the information storage element 100. In the method of writing and reading information of Example 1, exchange coupling between the ferromagnetic material layer and the antiferromagnetic regions is eliminated or decreased at the time of a motion of a domain wall. The method of writing and reading information in Example 1 is so-called a sequential method.

In FIGS. 2A to 2F and FIGS. 3A to 3E, the arrows drawn inside the ferromagnetic material layer 111 indicate directions of magnetization. For the sake of convenience, it is assumed that a right arrow represents information "0", and a left arrow represents information "1". The arrow drawn inside the third electrode 123 indicates a direction of magnetization in the magnetization reference layer 123B. When a current is supplied from the third electrode 123 to the second electrode 122, information "0" (a right arrow) is written into a portion of the ferromagnetic material layer 111 facing the third electrode 123. On the other hand, when a current is supplied from the second electrode 122 to the third electrode 123, information "1" (a left arrow) is written into the portion of the ferromagnetic material layer 111 facing the third electrode 123. Furthermore, a state in which exchange coupling is present between the ferromagnetic material layer 111 and an antiferromagnetic region 130 is shown by a hatched area of the ferromagnetic material layer 111 in FIGS. 2A to 2F and FIGS. 3A to 3E.

Figure 2A:
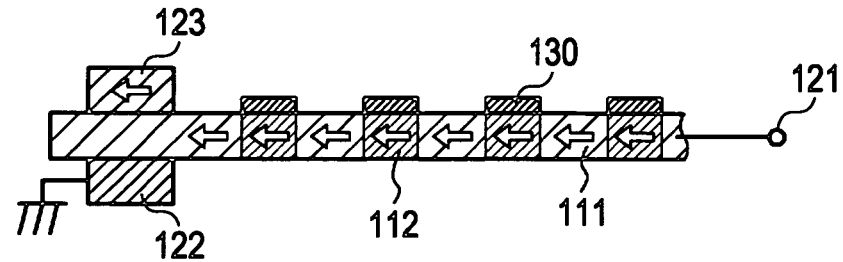
FIGS. 2A to 2F are conceptual views of the information storage element illustrating a method of writing information into and reading information from the information storage element of Example 1.

In the state shown in FIG. 2A, it is assumed that four pieces of information (1, 1, 1, 1) have already been written into the ferromagnetic material layer 111. In this state, it is considered that four magnetization regions 112 are formed in the ferromagnetic material layer 111.

Figure 2B:
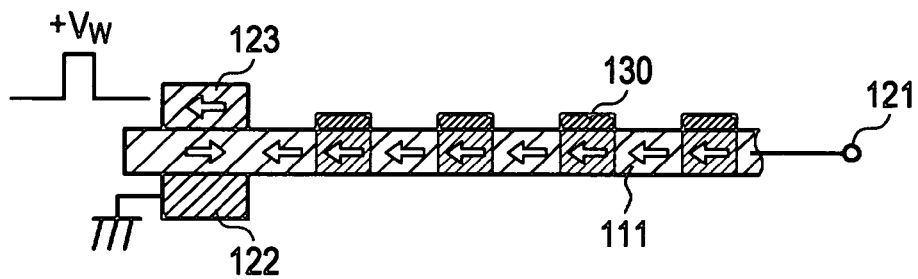

Next, it is supposed that information "0" is written into the ferromagnetic material layer 111. In this case, as shown in FIG. 2B, by applying a voltage $+V_w$ to the third electrode 123, a current is supplied from the third electrode 123 to the second electrode 122. Accordingly, information "0" (right arrow) is written into a portion of the ferromagnetic material layer 111, the portion facing the third electrode 123.

Figure 2C:
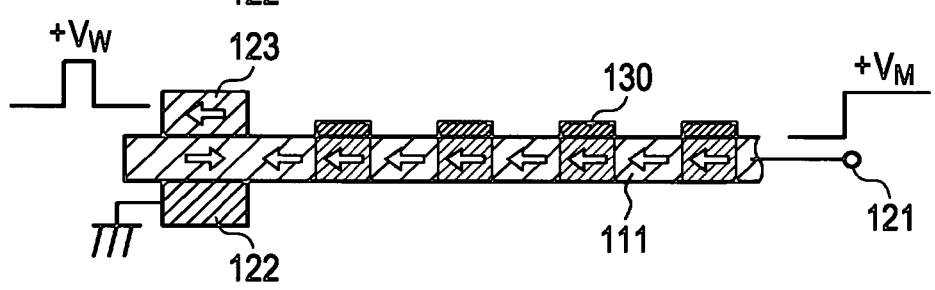
Figure 2D:
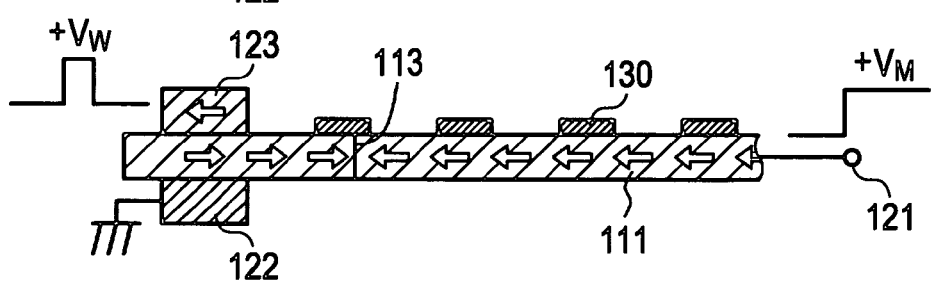

At the same time or immediately after the above application of the voltage, as shown in FIG. 2C, by applying a voltage $+V_m$ to the first electrode 121, a domain wall-moving current is supplied from the first electrode 121 to the second electrode 122. Consequently, as shown in FIG. 2D, Joule heat is generated inside the ferromagnetic material layer 111, and exchange coupling between the ferromagnetic material layer 111 and each of the antiferromagnetic regions 130 is eliminated or decreased by the generated Joule heat. In addition, by supplying the domain wall-moving current from the first electrode 121 to the second electrode 122, a current-induced domain wall motion occurs. Specifically, the magnetization state moves (propagates) from the left to the right. That is, a domain wall moves to the right. Here, since the exchange coupling between the ferromagnetic material layer 111 and each of the antiferromagnetic regions 130 has been eliminated or decreased, the motion of the domain wall 113 easily occurs. Even when the exchange coupling between the ferromagnetic material layer 111 and each of the antiferromagnetic regions 130 is eliminated or decreased and the domain wall 113 is moved, the information written into the ferromagnetic material layer 111 does not change.

Figure 2E:
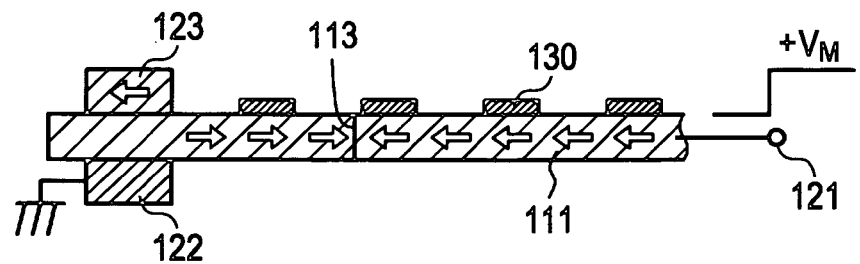
Figure 2F:
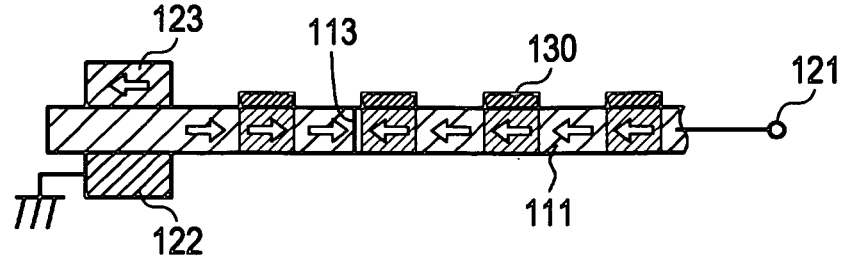

Next, when the domain wall 113 passes through a portion where the domain wall 113 contacts an antiferromagnetic region 130, as shown in FIG. 2E, the supply of the current from the third electrode 123 to the second electrode 122 is stopped. In addition, as shown in FIG. 2F, the supply of the domain wall-moving current is stopped or the value of the domain wall-moving current is decreased. When the value of the domain wall-moving current is decreased to a certain degree, the temperature of the ferromagnetic material layer 111 is decreased and the coupling with each of the antiferromagnetic regions 130 is recovered. Accordingly, the domain wall 113 is stopped just before a portion where the domain wall 113 contacts an antiferromagnetic region 130. Thus, one piece of information is written into the ferromagnetic material layer 111.

Figure 3A:
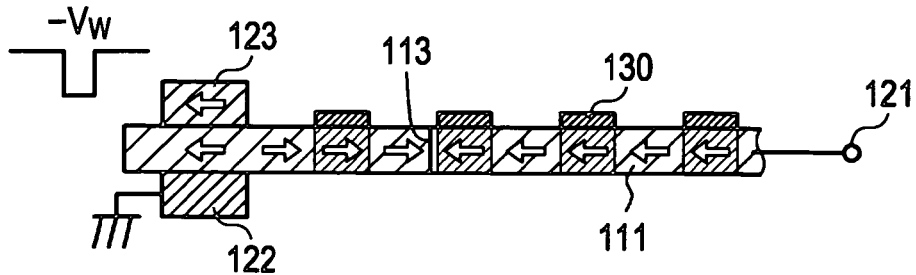
FIGS. 3A to 3E are continuous from FIG. 2F and conceptual views of the information storage element illustrating the method of writing information into and reading information from the information storage element of Example 1.

Next, it is supposed that information "1" is written into the ferromagnetic material layer 111. In this case, as shown in FIG. 3A, by applying a voltage $-V_w$ to the third electrode 123, a current is supplied from the second electrode 122 to the third electrode 123. Accordingly, information "1" (left arrow) is written into the portion of the ferromagnetic material layer 111 facing the third electrode 123.

Figure 3B:
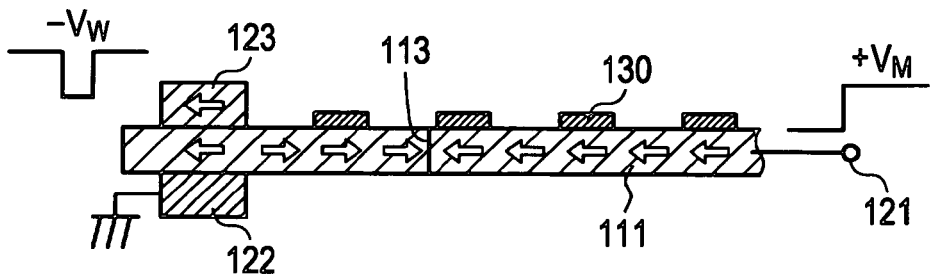
Figure 3C:
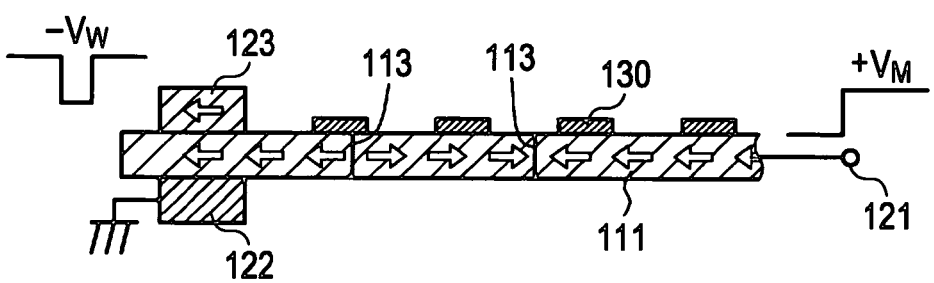

At the same time or immediately after the above application of the voltage, as shown in FIG. 3B, by applying a voltage $+V_m$ to the first electrode 121, a domain wall-moving current is supplied from the first electrode 121 to the second electrode 122. Consequently, as in the case described above, exchange coupling between the ferromagnetic material layer 111 and each of the antiferromagnetic regions 130 is eliminated or decreased by the generated Joule heat. In addition, a current-induced domain wall motion occurs (see FIG. 3C).

Figure 3D:
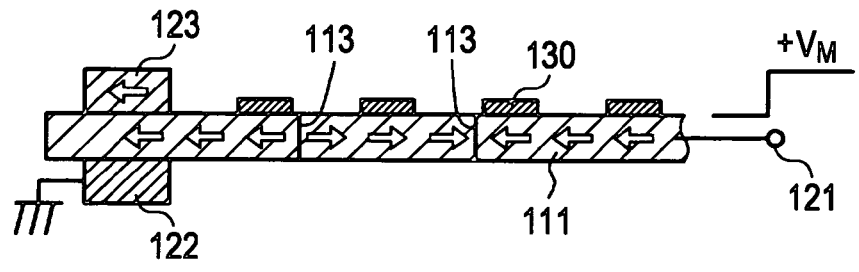
Figure 3E:
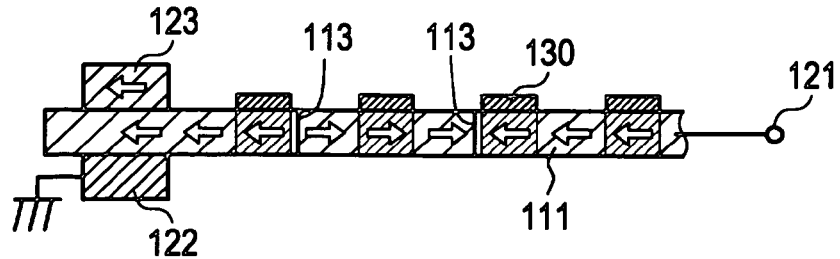

Next, as shown in FIG. 3D, the supply of the current from the second electrode 122 to the third electrode 123 is stopped. In addition, as shown in FIG. 3E, the supply of the domain wall-moving current is stopped or the value of the domain wall-moving current is decreased. Thus, one piece of information is written into the ferromagnetic material layer 111. In this state, six pieces of information (1, 1, 1, 1, 0, 1) are written into the ferromagnetic material layer 111, but the first two pieces of information are not shown in FIG. 3E. Information may be sequentially written into the ferromagnetic material layer 111 while moving the domain walls 113 by supplying the domain wall-moving current from the first electrode 121 to the second electrode 122.

When information written in the ferromagnetic material layer 111 is read, a domain wall-moving current is supplied from the second electrode 122 to the first electrode 121. Accordingly, Joule heat is generated, and exchange coupling between the ferromagnetic material layer 111 and each of the antiferromagnetic regions 130 is eliminated or decreases. In addition, the domain walls 113 move. Next, by stopping the supply of the domain wall-moving current from the second electrode 122 to the first electrode 121, the coupling between the ferromagnetic material layer 111 and each of the antiferromagnetic regions 130 is recovered and the motion of the magnetization regions 112 is stopped. Subsequently, a current is supplied from the third electrode 123 to the second electrode 122 to examine the level of the electrical resistance value of a magnetization region 112. Thus, whether the written information is "0" or "1" can be determined. Here, when the magnetization direction of the ferromagnetic material layer 111 is the same as that of the magnetization reference layer 123B, the electrical resistance is low. When the magnetization direction of the ferromagnetic material layer 111 is antiparallel to that of the magnetization reference layer 123B, the electrical resistance is high. The information written into the ferromagnetic material layer 111 may be sequentially read while moving the domain walls 113 by supplying the domain wall-moving current from the second electrode 122 to the first electrode 121.

The outline of a method of producing the information storage element 100 of Example 1 will now be described with reference to FIGS. 4A to 4D, which are schematic partial cross-sectional views of a substrate etc.

[Step-100]

Figure 4A:
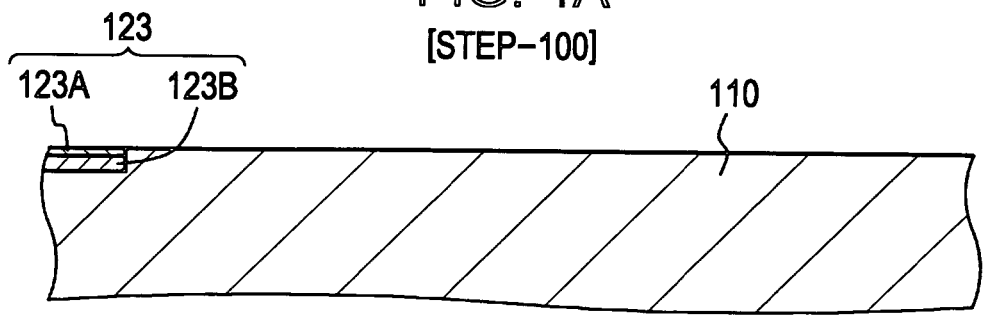
FIGS. 4A to 4D are schematic partial cross-sectional views of a substrate etc. illustrating a method of producing the information storage element of Example 1.
Figure 4B:
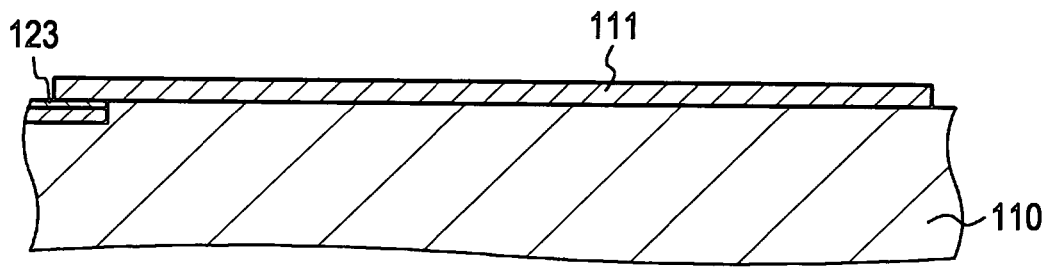
Figure 4C:
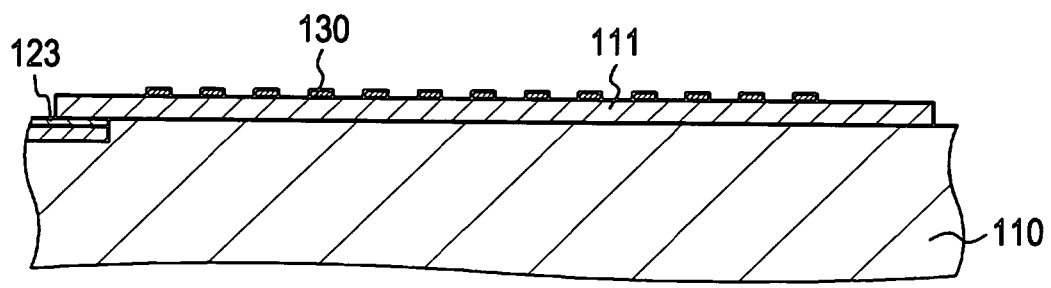

First, a third electrode 123 is formed in a substrate 110 composed of a silicon semiconductor substrate. The third electrode 123 may be formed on the substrate 110. However, preferably, a difference in level between the substrate 110 and the third electrode 123 is small so as not to inhibit a motion of a domain wall 113. For this purpose, it is desirable to form a third electrode 123 embedded in the substrate 110. Specifically, a trench is formed in the substrate 110 by a lithography technique and an etching technique. Subsequently, a magnetization reference layer 123B and a non-magnetic film 123A are formed over the entire surface of the substrate 110 by a sputtering method. Next, the non-magnetic film 123A and the magnetization reference layer 123B disposed on the surface of the substrate 110 are removed by, for example, a CMP method, thus leaving the non-magnetic film 123A and the magnetization reference layer 123B in the trench. Accordingly, as shown in FIG. 4A, the third electrode 123 can be formed in the substrate 110. The magnetization reference layer 123B is connected to an information writing/reading power supply (not shown) via a wiring (not shown) provided on the substrate 110.

[Step-110]

Next, a ferromagnetic material layer is formed over the entire surface of the substrate 110 by a sputtering method. The ferromagnetic material layer is then patterned to form a strip-shaped ferromagnetic material layer 111 (see FIG. 4B). The patterning of the ferromagnetic material layer 111 can be performed by an ion milling method, a reactive etching method, or the like. Alternatively, a lift-off method may be employed.

[Step-120]

Subsequently, antiferromagnetic regions 130 that are arranged with a space therebetween are formed. Specifically, an antiferromagnetic material layer is formed over the entire surface by a sputtering method, and the antiferromagnetic material layer is then patterned by an ion milling method or a reactive etching method. Thus, the antiferromagnetic regions 130 that are arranged with a space therebetween can be obtained (see FIG. 4C). Alternatively, the antiferromagnetic regions 130 may be formed by forming a ferromagnetic material layer and an antiferromagnetic material layer, then patterning the antiferromagnetic material layer, and further patterning the ferromagnetic material layer.

[Step-130]

Figure 4D:
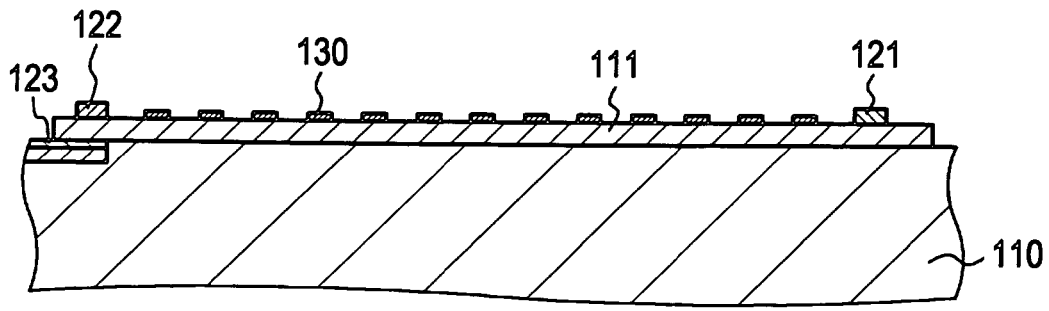

Subsequently, a first electrode 121 and a second electrode 122 are formed at both ends of the strip-shaped ferromagnetic material layer 111 by an ordinary method (see FIG. 4D). Subsequently, an interlayer insulating layer 114 composed of an insulating material is formed over the entire surface by, for example, a CVD method. Openings are then formed in portions of the interlayer insulating layer 114, the portions being located on the first electrode 121 and the second electrode 122. Wirings 124 and 125 are then formed on the interlayer insulating layer 114 including the inside of the openings. Thus, the information storage element 100 of Example 1 shown in FIGS. 1A and 1B can be produced. Examples of the material constituting the interlayer insulating layer 114 include $SiO_x$ materials (materials constituting a silicon oxide film) such as $SiO_2$, non-doped silicate glass (NSG), boron phosphorus silicate glass (BPSG), PSG, BSG, AsSG, SbSG, and spin-on-glass (SOG); SiN; SiON; SiOC; SiOF; SiCN; low-dielectric constant insulating materials (such as fluorocarbons, cycloperfluorocarbon polymers, benzocyclobutene, cyclic fluorocarbon resins, polytetrafluoroethylene, amorphous tetrafluoroethylene, fluorinated aryl ethers, fluorinated polyimides, amorphous carbon, organic SOG, parylenes, and fluorinated fullerenes); polyimide resins; fluorocarbon resins; Silk (trademark, a coat-type low-dielectric constant interlayer insulating film material, manufactured by The Dow Chemical Co.) and Flare (trademark, a polyallyl ether (PAE) manufactured by Honeywell Electronic Materials Co.).

In the information storage element 100 of Example 1, the magnetization direction of the ferromagnetic material layer 111 is fixed by each antiferromagnetic region 130 at room temperature, and thus information can be reliably held for a long time. Furthermore, when information is written or read, domain walls can be easily moved by eliminating or decreasing exchange coupling between the ferromagnetic material layer and each of the antiferromagnetic regions. Accordingly, even when the domain walls are moved a long distance in the ferromagnetic material layer, the occurrence of a problem that information errors readily occur can be reliably prevented. As a result, according to this embodiment of the present invention, recording and reading of information can be reliably performed while stably holding information and a large amount of information can be recorded in a single continuous magnetic element. Consequently, a compact, lightweight, and inexpensive information storage unit can be realized.

EXAMPLE 2

Figure 5A:
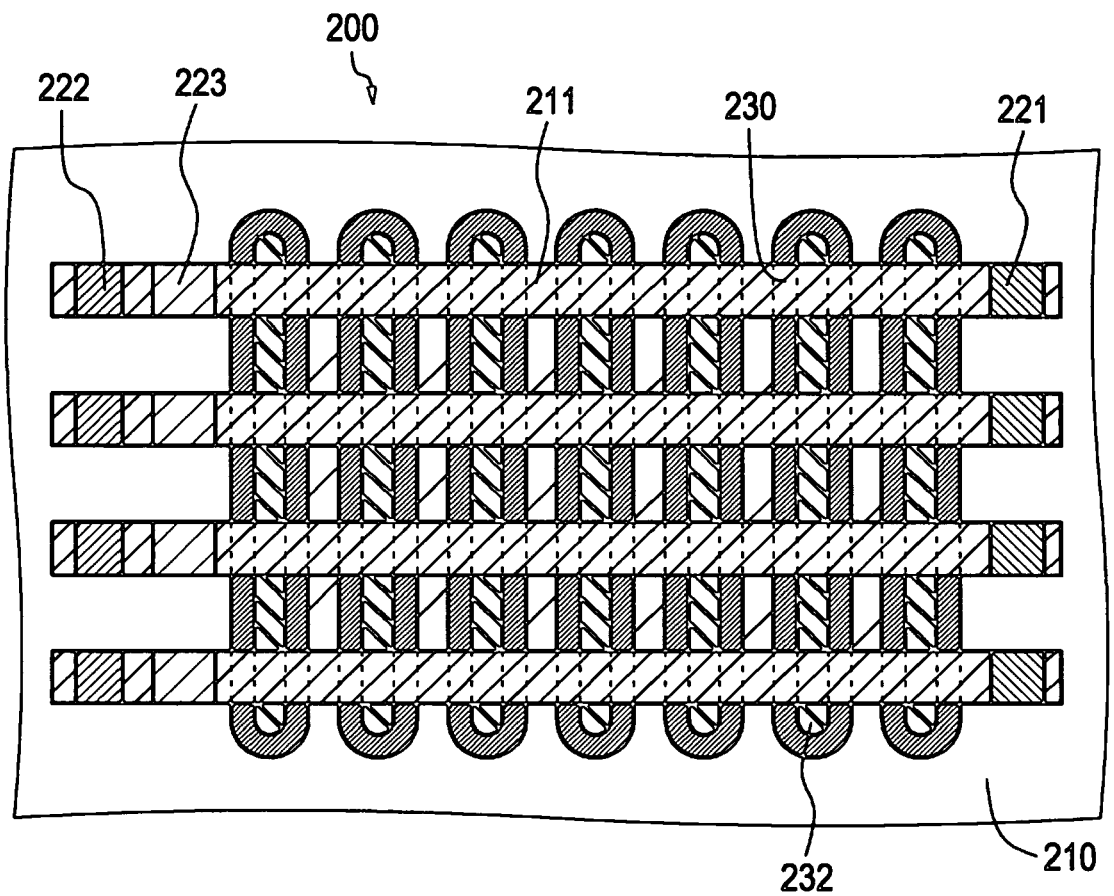
FIG. 5A is a schematic partial plan view of information storage elements of Example 2.
Figure 5B:
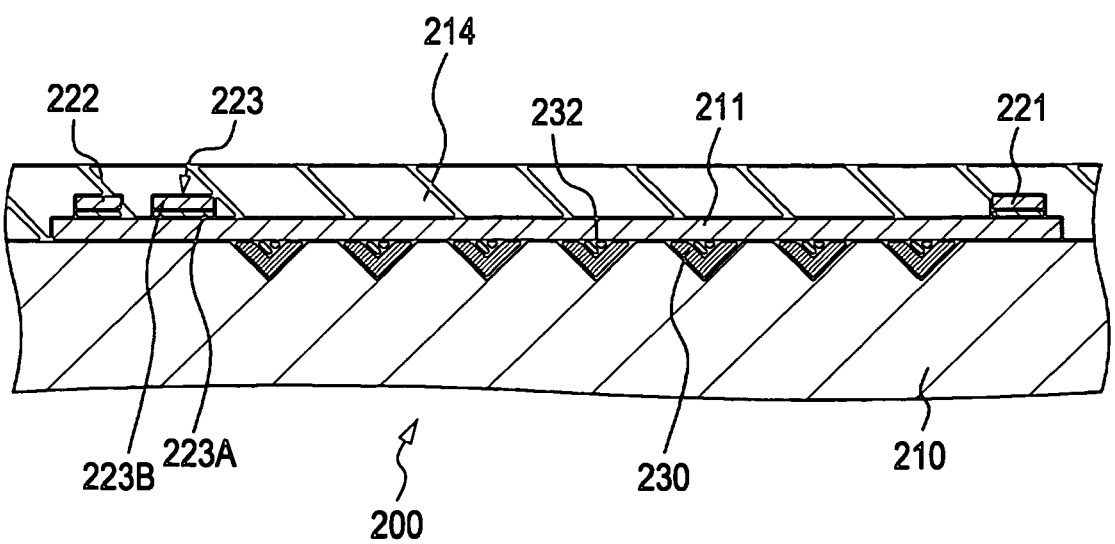
FIG. 5B is a schematic partial cross-sectional view of the information storage elements of Example 2.
Figure 7A:
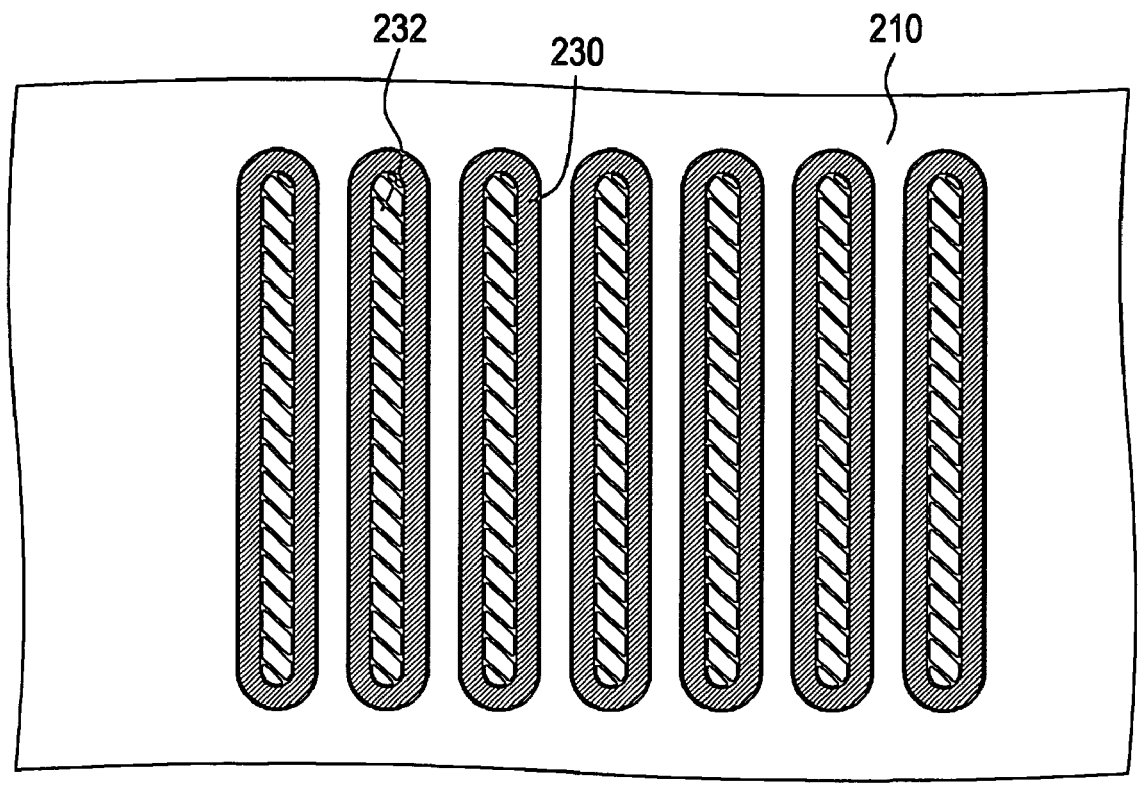
FIG. 7A is continuous from FIG. 6A and a partial plan view illustrating the method of producing the information storage element of Example 2.
Figure 8A:
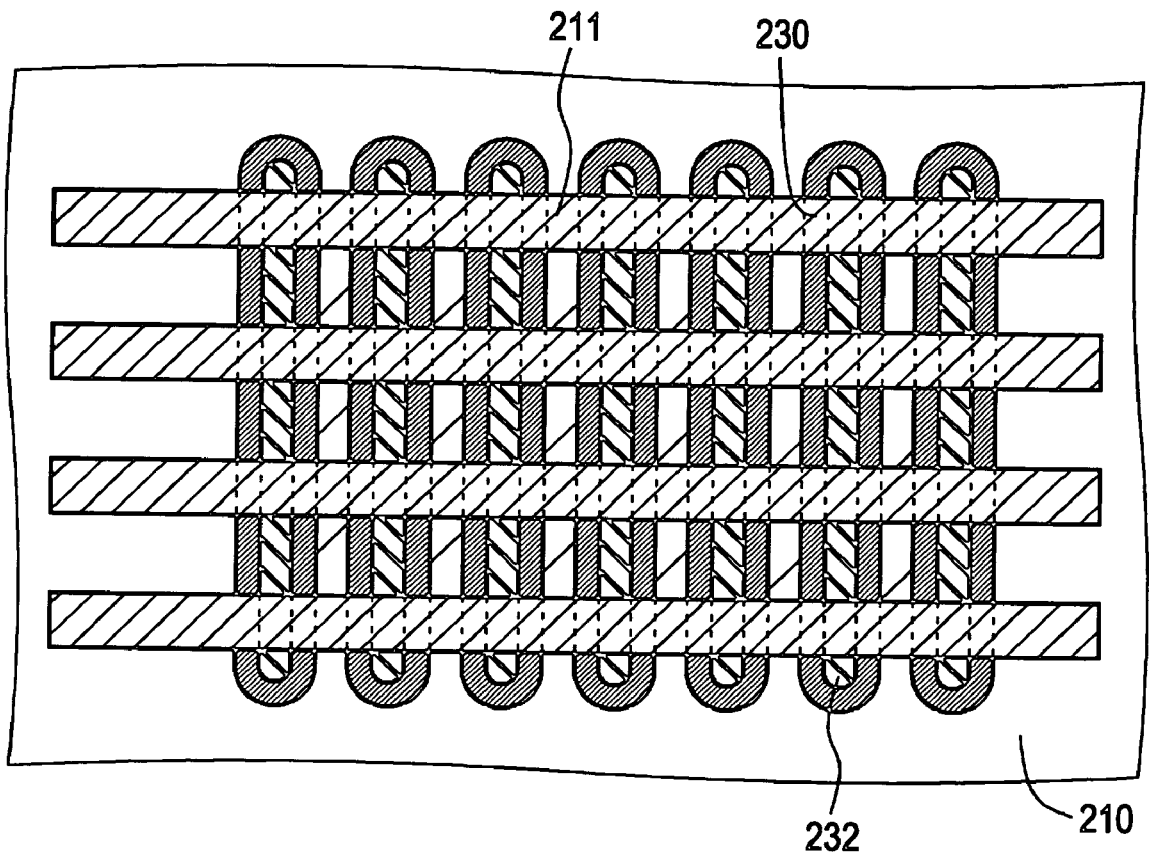
FIG. 8A is continuous from FIG. 7A and a partial plan view illustrating the method of producing the information storage element of Example 2.

Example 2 is a modification of Example 1. FIG. 5A is a schematic partial plan view of information storage elements 200 of Example 2, and FIG. 5B is a schematic partial cross-sectional view of the information storage elements 200. In the example shown in FIG. 5A, four information storage elements 200 are juxtaposed. In the information storage elements 200 of Example 2 and information storage elements of Examples described below, components indicated by reference numerals having the same last two digits as those of components constituting the information storage element 100 of Example 1 are the same as the corresponding components of the information storage element 100 of Example 1. In FIG. 5A, an interlayer insulating layer 214 is omitted. In FIG. 5A and FIGS. 7A and 8A described below, in order to clearly show antiferromagnetic regions 230, an insulating film 232, a first electrode 221, a second electrode 222, and a third electrode 223, these components are represented by hatched areas.

In each of the information storage elements 200 of Example 2, the antiferromagnetic regions 230 are provided on a substrate 210. The second electrode 222 and the third electrode 223 are disposed on the same side of a ferromagnetic material layer 211. More specifically, the ferromagnetic material layer 211 is provided on the substrate 210, and the first electrode 221, the second electrode 222, and the third electrode 223 are provided on the ferromagnetic material layer 211.

Figure 6A:
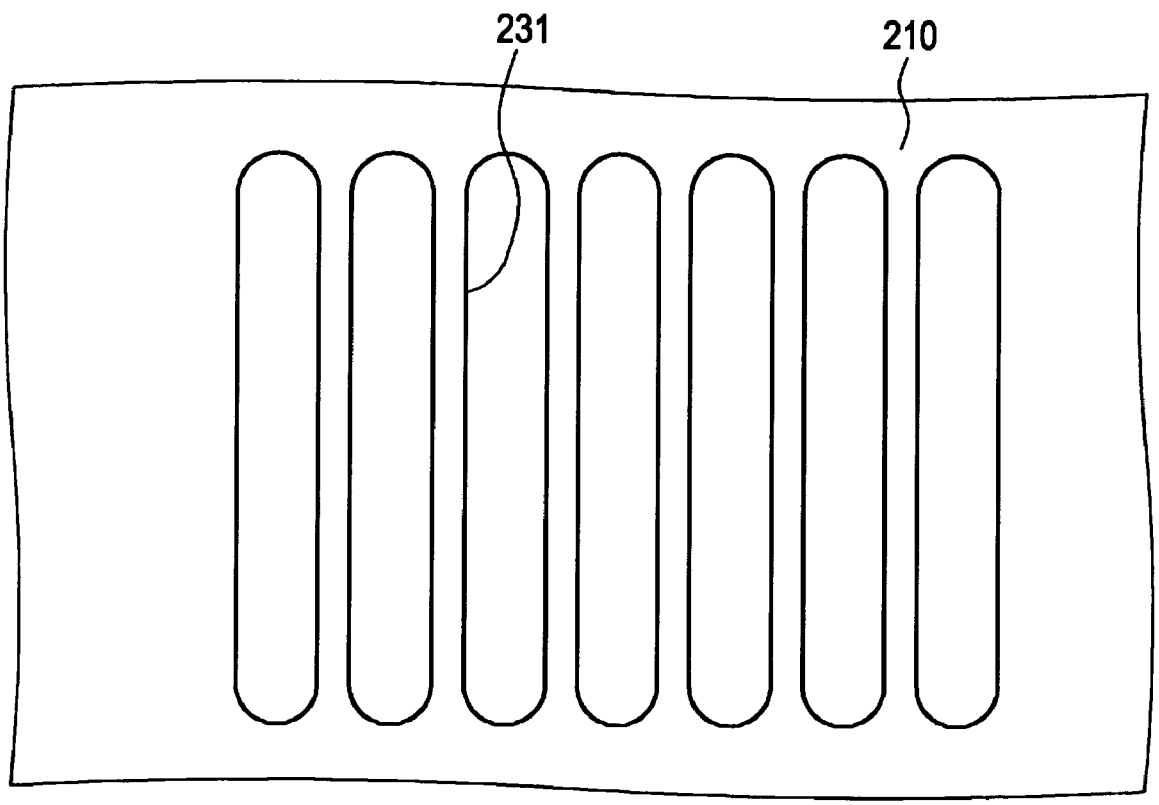
FIG. 6A is a partial plan view illustrating a method of producing the information storage element of Example 2.
Figure 6B:
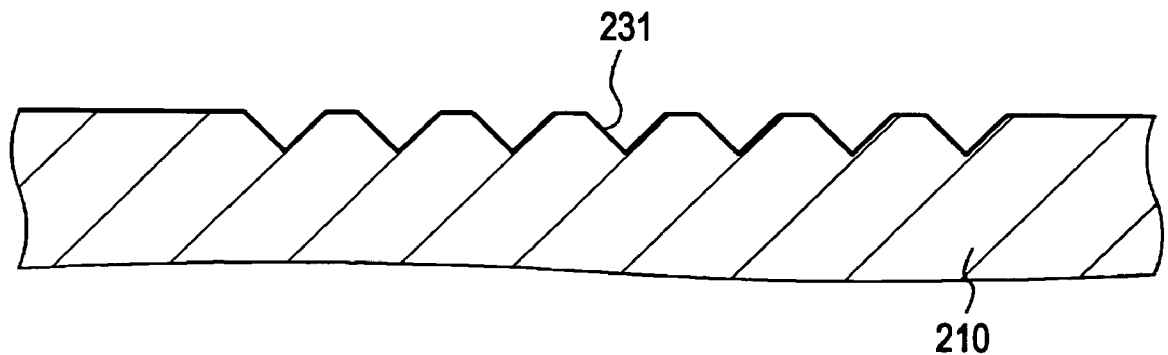
FIG. 6B is a schematic partial cross-sectional view of a substrate etc. illustrating the method of producing the information storage element of Example 2.
Figure 7B:
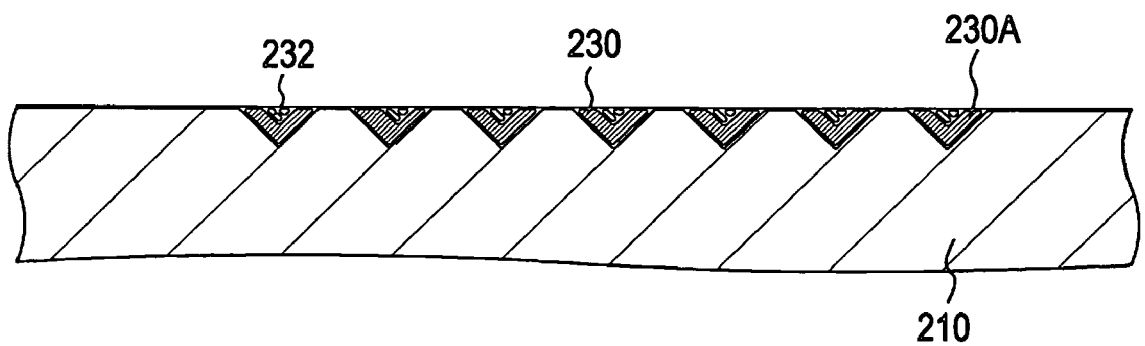
FIG. 7B is continuous from FIG. 6B and a schematic partial cross-sectional view of the substrate etc. illustrating the method of producing the information storage element of Example 2.
Figure 8B:
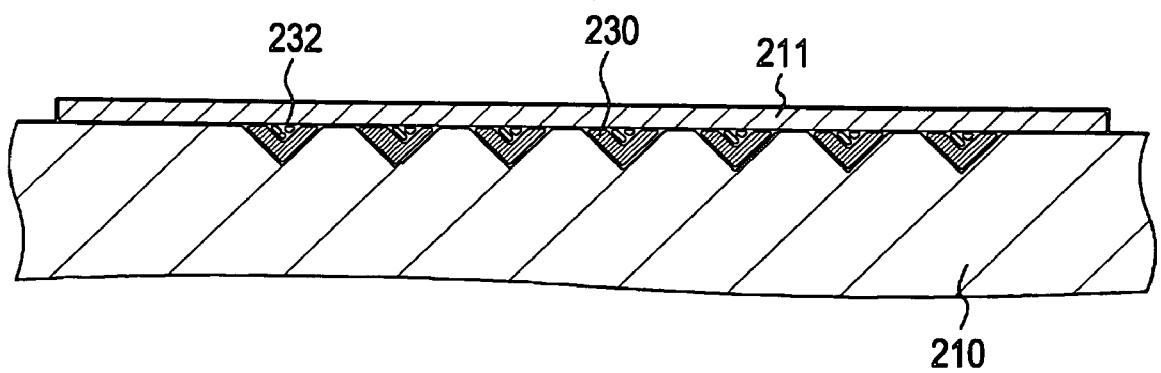
FIG. 8B is continuous from FIG. 7B and a schematic partial cross-sectional view of the substrate etc. illustrating the method of producing the information storage element of Example 2.

The outline of a method of producing the information storage elements 200 of Example 2 will now be described with reference to FIGS. 6A, 7A, and 8A, which are schematic partial plan views of a substrate etc. and FIGS. 6B, 7B, and 8B, which are schematic partial end views thereof.

[Step-200]

First, antiferromagnetic regions 230 that are arranged with a space therebetween are formed on a substrate 210 composed of a silicon semiconductor substrate. Specifically, trenches 231 each having a "V" cross-sectional shape are formed on the substrate 210 composed of a silicon semiconductor substrate by a lithography technique and an etching technique (see FIGS. 6A and 6B). Each of the trenches 231 had a width of 1 μm and a depth of about 0.5 μm. The pitch of the trenches 231 was 1.5 μm. The number of trenches per information storage element 200 was eight. Subsequently, an antiferromagnetic material layer composed of NiO and having a thickness of 0.2 μm, and an insulating film 232 composed of SiO$_2$ and having a thickness of 0.5 μm are formed over the entire surface by a sputtering method. The antiferromagnetic material layer and the insulating film 232 disposed on the surface of the substrate 210 are then removed by a CMP method, thus leaving an antiferromagnetic material layer 230A and the insulating film 232 in the trenches 231. Thus, antiferromagnetic regions 230 can be formed at 16 positions on the substrate 210 with a space therebetween (see FIGS. 7A and 7B).

[Step-210]

Subsequently, as in Step-110 of Example 1, a ferromagnetic material layer is formed over the entire surface by a sputtering method, and is then patterned. Consequently, strip-shaped ferromagnetic material layers 211 each having a width of 0.15 μm and a length of 30 μm are obtained (see FIGS. 8A and 8B).

[Step-220]

Next, in order to form a third electrode 223, a non-magnetic film 223A and a magnetization reference layer 223B are formed over the entire surface by a sputtering method. Subsequently, a wiring (not shown) composed of Ti is formed on the magnetization reference layer 223B, and in addition, a first electrode 221 that also functions as a wiring and a second electrode 222 that also functions as a wiring are formed. The exposed magnetization reference layer 223B and non-magnetic film 223A are then patterned by an ordinary method. Next, an interlayer insulating layer 214 composed of an insulating material is formed over the entire surface by, for example, a CVD method. Thus, the information storage elements 200 of Example 2 shown in FIGS. 5A and 5B can be produced.

In the information storage elements 200 of Example 2 thus obtained, the electrical resistance value between the first electrode 221 and the second electrode 222 was 1.3 kΩ, and the electrical resistance value between the second electrode 222 and the third electrode 223 was 300Ω.

The second electrode 222 was connected to the ground, and a constant voltage $+V_m$ was applied to the first electrode 221 for a time length of 16$t_r$, while applying a square-wave voltage with an amplitude of ±1 volt and a period $t_r$ to the third electrode 223, thus writing information of 16 bits (including alternate information of "0" and "1") in the ferromagnetic material layer 211. Subsequently, in order to read the information, a voltage $-V_m$ was applied to the first electrode 221. The number of domain walls was measured by determining the number of times of a change in the resistance value measured between the third electrode 223 and the second electrode 222. This measurement was repeatedly performed to determine the ratio (domain wall reproduction ratio) of the number of reproduced domain walls to the number of recorded domain walls (specifically 16). When the domain wall reproduction ratio is "0", it shows a state where no domain wall is reproduced. When the domain wall reproduction ratio is "1", it shows a state where domain walls, the number of which is the same as the number of recorded domain walls, are reproduced.

FIG. 9A shows the relationship between the domain wall reproduction ratio and the period $t_r$ when a voltage $+V_m$ was applied to the first electrode 221. As a comparative example, an information storage element that did not include the antiferromagnetic regions 230 was prepared by omitting Step- 200 above, and the same measurement was performed. FIG. 9B shows the results. As shown in FIG. 9A, a domain wall reproduction ratio of "1" can be realized by optimizing the voltage $+V_m$ applied to the first electrode 221 and the period $t_r$. In contrast, as shown in FIG. 9B, in the case where the antiferromagnetic regions 230 were not formed, the domain walls were not appropriately fixed, and thus the domain wall reproduction ratio did not reach "1".

Figure 10A:
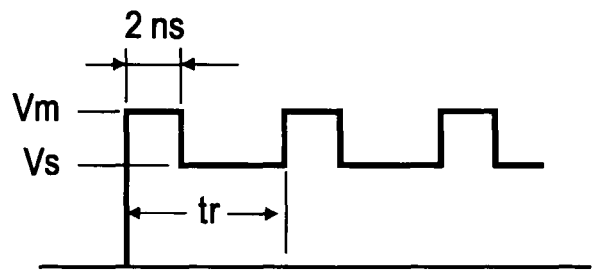
FIG. 10A shows an example of modulation of the voltage applied to the first electrode of the information storage element of Example 2.
Figure 10B:
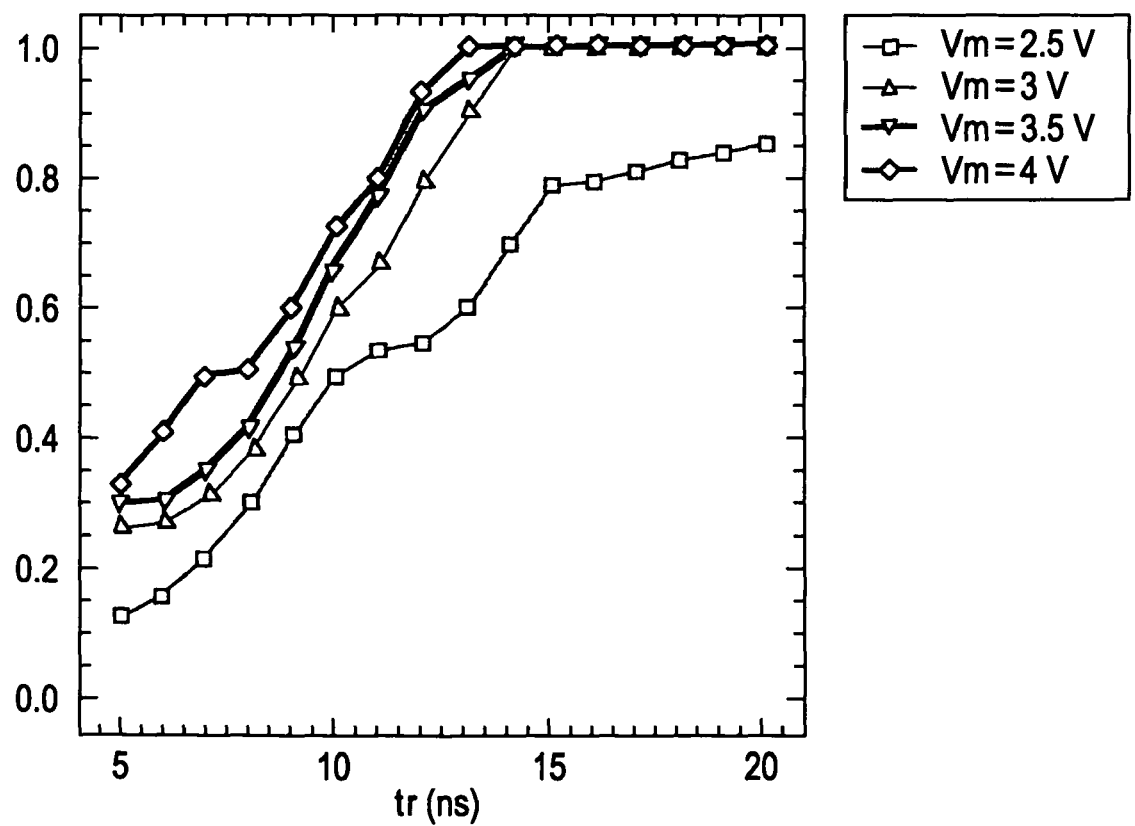
FIG. 10B is a graph showing measurement results of a domain wall reproduction ratio when the voltage shown in FIG. 10A was applied.

Furthermore, as shown in FIG. 10A, the voltage applied to the first electrode 221 was modulated. Specifically, a voltage $+V_m$ and a voltage $+V_s$ were alternately applied to the first electrode 221. Here, the value of the voltage $+V_m$ applied to the first electrode 221 was changed to 2.5 V, 3.0 V, 3.5 V, and 4.0 V, and the time width during which the voltage $+V_m$ was applied was 2 nanoseconds. The value of voltage $+V_s$ was 1.5 V. Furthermore, a pulse of one voltage $+V_m$ was applied during one period $t_r$. FIG. 10B shows the measurement results of the domain wall reproduction ratio in this case. It was found that a stable operation could be realized under the conditions of a voltage $+V_m$ of 3.0 V or more and a period $t_r$ of 15 nanoseconds or more. Specifically, by regularly modulating a current that is supplied to the ferromagnetic material layer 211 in order to cause a current-induced domain wall motion, the speed of the motion of a domain wall can be kept constant, and elimination or a change in the magnetized information during writing or reading of information can be more reliably suppressed. The modulation of a domain wall-moving current when the domain wall-moving current is supplied from the first electrode 221 to the second electrode 222 or the modulation of a domain wall-moving current when the domain wall-moving current is supplied from the second electrode 222 to the first electrode 221 may be a voltage modulation, a pulse-width modulation in which a pulse width is changed, or a combination of these. This also applies to Examples below.

EXAMPLE 3

Example 3 is also a modification of Example 1. Example 2 relates to the second information storage element and the second method of writing and reading information. In Example 3, a blocking temperature TB in antiferromagnetic regions is varied in a direction of the axis of a ferromagnetic material layer (item [B] described above).

Figure 11A:
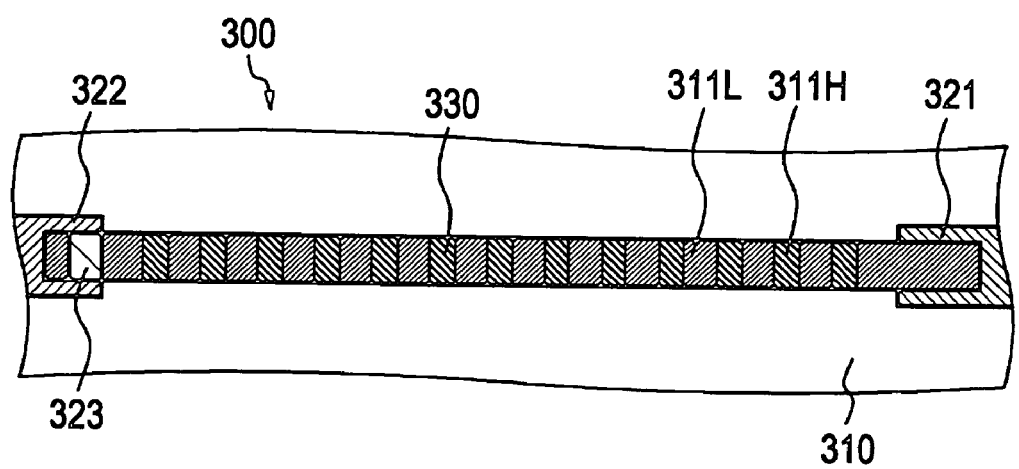
FIG. 11A is a schematic partial plan view of an information storage element of Example 3.
Figure 11B:
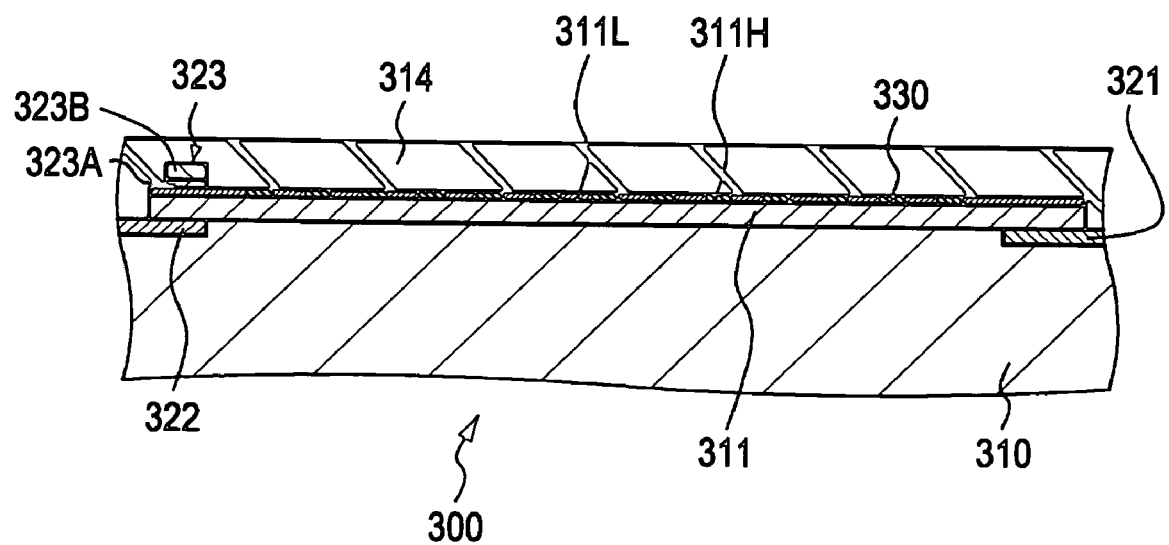
FIG. 11B is a schematic partial cross-sectional view of the information storage element of Example 3.

FIG. 11A is a schematic partial plan view of an information storage element of Example 3, and FIG. 11B is a schematic partial cross-sectional view of the information storage element. As shown in FIGS. 11A and 11B, in Example 3, the composition of antiferromagnetic regions 330 varies, and an upper limit temperature at which the magnetization state of a magnetization region can be fixed (blocking temperature TB) varies between the antiferromagnetic regions 330. When the number of bits of information to be stored is represented by N, the number of antiferromagnetic regions 330H having a high blocking temperature TB is N or more (N in Example 3 and specifically N=16). The antiferromagnetic regions 330 having different blocking temperatures TB are divided into two groups. The antiferromagnetic regions 330H having a high blocking temperature TB and antiferromagnetic regions 330L having a low blocking temperature TB are alternately arranged. In FIG. 11A, an interlayer insulating layer 314 is omitted. In FIG. 11B, the antiferromagnetic regions 330H having a high blocking temperature TB are shown by the areas hatched from top left to bottom right. As described above, the upper limit temperature at which the magnetization state of a magnetization region can be fixed (blocking temperature TB) is varied in the antiferromagnetic regions 330. Accordingly, when a domain wall-moving current is applied to a ferromagnetic material layer 311 and the temperature of the ferromagnetic material layer 311 and the antiferromagnetic regions 330 is represented by $T_0$, in the case where the blocking temperature TB of the antiferromagnetic regions 330H is higher than the temperature $T_0$, exchange coupling between each of the antiferromagnetic regions 330H and a corresponding portion of the ferromagnetic material layer 311 that is in contact with the antiferromagnetic region 330H is not eliminated. On the other hand, in the case where the blocking temperature TB of the antiferromagnetic regions 330L is lower than the temperature $T_0$, exchange coupling between each of the antiferromagnetic regions 330L and a corresponding portion of the ferromagnetic material layer 311 that is in contact with the antiferromagnetic region 330L is eliminated. Accordingly, by varying the blocking temperature TB in the antiferromagnetic regions 330, an elimination state or decreasing state of the exchange coupling between each of the antiferromagnetic regions 330 and the ferromagnetic material layer 311 can be controlled in accordance with the temperature of the antiferromagnetic regions 330 and the ferromagnetic material layer 311. In Example 3, the blocking temperature TB in the antiferromagnetic regions 330H having a high blocking temperature TB is in the range of 200° C. to 250° C., and the blocking temperature TB in the antiferromagnetic regions 330L having a low blocking temperature TB is room temperature or lower. In order to vary the blocking temperature TB as described above, when oxygen ions are ion-implanted into the antiferromagnetic regions 330, the amount of oxygen ions implanted is changed. Alternatively, the blocking temperature TB of the antiferromagnetic regions 330 can be varied by varying the structure of the antiferromagnetic regions 330, for example, by varying the thickness of the antiferromagnetic regions 330.

In Example 3, the antiferromagnetic regions 330 are provided so as to cover the entire surface of the ferromagnetic material layer 311.

In Example 3, when a domain wall-moving current is supplied from a first electrode 321 to a second electrode 322 or a domain wall-moving current is supplied from the second electrode 322 to the first electrode 321, Joule heat is generated inside the ferromagnetic material layer 311, and the temperatures of the ferromagnetic material layer 311 and the antiferromagnetic regions 330 are increased by the generated Joule heat. Here, the blocking temperature TB is designed and the domain wall-moving current is set so that a state can be realized in which, in the antiferromagnetic regions 330H having a high blocking temperature TB, the elimination or the decrease in the exchange coupling between the ferromagnetic material layer 311 and each of the antiferromagnetic regions 330 does not occur, whereas in the antiferromagnetic regions 330L having a low blocking temperature TB, the elimination or the decrease in the exchange coupling between the ferromagnetic material layer 311 and each of the antiferromagnetic regions 330 occurs. Accordingly, in the antiferromagnetic regions 330H having a high blocking temperature TB, the elimination or the decrease in the exchange coupling between the ferromagnetic material layer 311 and each of the antiferromagnetic regions 330 does not occur. On the other hand, in the antiferromagnetic regions 330L having a low blocking temperature TB, the elimination or the decrease in the exchange coupling between the ferromagnetic material layer 311 and each of the antiferromagnetic regions 330 occurs. Here, a domain wall located in a portion of the ferromagnetic material layer 311 before the start of a motion, the portion being located under an antiferromagnetic region 330H having a high blocking temperature TB starts to move when a domain wall-moving current is applied. The domain wall then rapidly passes through a portion of the ferromagnetic material layer 311, the portion being located under an antiferromagnetic region 330L having a low blocking temperature TB. When the supply of the domain wall-moving current is stopped or the value of the domain wall-moving current is decreased while the domain wall passes through the portion of the ferromagnetic material layer 311 located under the antiferromagnetic region 330L having the low blocking temperature TB, or at the time of the completion of the passage, in the portion of the ferromagnetic material layer 311 located under the antiferromagnetic region 330L having a low blocking temperature TB, exchange coupling between the ferromagnetic material layer 311 and the antiferromagnetic region 330 is immediately generated again. Therefore, the motion of the domain wall can be reliably stopped in the portion of the ferromagnetic material layer 311 located under the antiferromagnetic region 330H having the high blocking temperature TB.

As in Example 2, in the configuration and the structure of Example 3, from the substrate side, the antiferromagnetic regions 330 and the ferromagnetic material layer 311 may be formed in that order. This structure can also apply to Examples 4, 5, and 6 described below. In Example 3 and Examples 4, 5, and 6 described below, the first and second electrodes are provided in portions of the substrate disposed under the ferromagnetic material layer, and the third electrode is provided on the ferromagnetic material layer. Alternatively, the arrangement of the first electrode, the second electrode, and the third electrode may be the same as the arrangement in Example 1 or Example 2. The arrangement of the electrodes can also apply to Examples 4, 5, and 6 described below.

EXAMPLE 4

Example 4 is also a modification of Example 1. Example 4 relates to the third information storage element and the third method of writing and reading information. In Example 4, a variation of an increase in the temperature of a ferromagnetic material layer (ferromagnetic recording layer) is generated in a direction of the axis of a ferromagnetic material layer (item [A] described above).

Figure 12A:
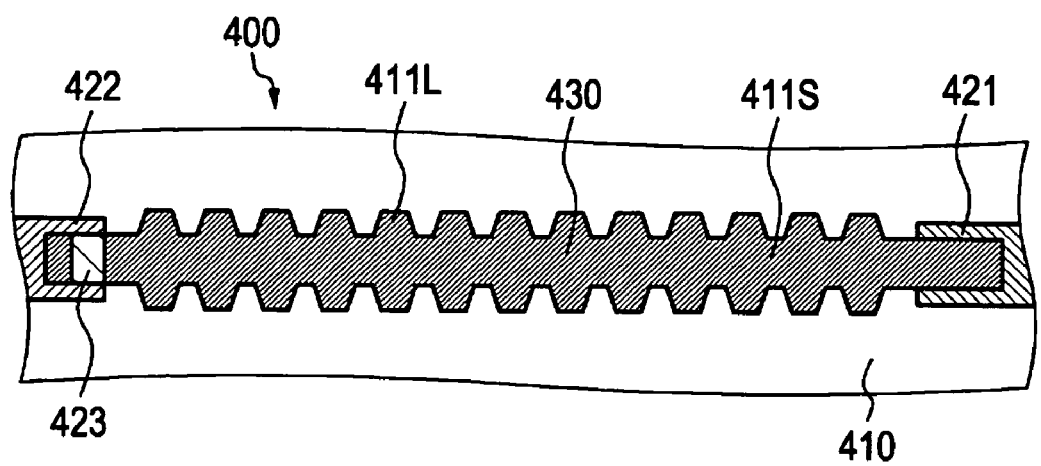
FIG. 12A is a schematic partial plan view of an information storage element of Example 4.
Figure 12B:
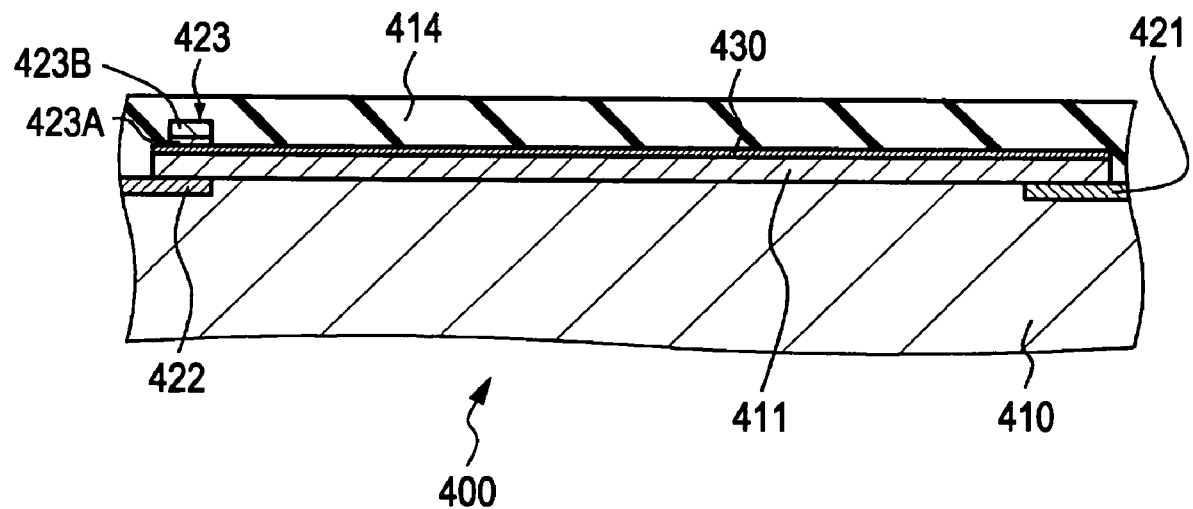
FIG. 12B is a schematic partial cross-sectional view of the information storage element of Example 4.

FIG. 12A is a schematic partial plan view of an information storage element of Example 4, and FIG. 12B is a schematic partial cross-sectional view of the information storage element. As shown in FIGS. 12A and 12B, in Example 4, the cross-sectional area of a ferromagnetic material layer 411 when the ferromagnetic material layer 411 is cut along a virtual plane orthogonal to a direction of the axis of the ferromagnetic material layer 411 varies in a direction of the axis of the ferromagnetic material layer 411. More specifically, regions 411L of the ferromagnetic material layer 411 having a large cross-sectional area and regions 411S of the ferromagnetic material layer 411 having a small cross-sectional area, the cross-sectional areas being obtained when the ferromagnetic material layer 411 is cut along a virtual plane orthogonal to the direction of the axis of the ferromagnetic material layer 411, are alternately provided in the direction of the axis of the ferromagnetic material layer 411. When the number of bits of information to be stored is represented by N, the number of regions of the ferromagnetic material layer having the large cross-sectional area is N or more (N in Example 4 and specifically N=16). The regions of the ferromagnetic material layer 411 having different cross-sectional areas are divided into two groups. By varying the cross-sectional area of the ferromagnetic material layer 411 in the direction of the axis of the ferromagnetic material layer 411 as described above, when a domain wall-moving current is applied to the ferromagnetic material layer 411, a variation of an increase in the temperature of the ferromagnetic material layer (ferromagnetic recording layer) 411 can be generated in the direction of the axis of the ferromagnetic material layer 411. In FIG. 12A, an interlayer insulating layer 414 is omitted.

In Example 4, an antiferromagnetic region 430 is provided so as to cover the entire surface of the ferromagnetic material layer 411.

In Example 4, when a domain wall-moving current is supplied from a first electrode 421 to a second electrode 422 or a domain wall-moving current is supplied from the second electrode 422 to the first electrode 421, Joule heat is generated inside the ferromagnetic material layer 411, and the temperatures of the ferromagnetic material layer 411 and the antiferromagnetic region 430 are increased by the generated Joule heat. Here, the increase in the temperature $\Delta T_L$ in a region 411L of the ferromagnetic material layer 411 having a large cross-sectional area is smaller than the increase in the temperature $\Delta T_s$ in a region 411S of the ferromagnetic material layer 411 having a small cross-sectional area. Accordingly, in the region 411S of the ferromagnetic material layer 411 having a small cross-sectional area, elimination or a decrease in exchange coupling between the ferromagnetic material layer 411 and the antiferromagnetic region 430 reliably occurs as compared with the region 411L of the ferromagnetic material layer 411 having a large cross-sectional area. Here, a domain wall located in a region 411L of the ferromagnetic material layer 411 having a large cross-sectional area before the start of a motion starts to move when a domain wall-moving current is applied. The domain wall then rapidly passes through a region 411S of the ferromagnetic material layer 411 having a small cross-sectional area. When the supply of the domain wall-moving current is stopped or the value of the domain wall-moving current is decreased while the domain wall passes through the region 411S of the ferromagnetic material layer 411 having the small cross-sectional area or at the time of the completion of the passage, the temperature of the region 411L of the ferromagnetic material layer 411 having the large cross-sectional area immediately decreases, and exchange coupling between the ferromagnetic material layer 411 and the antiferromagnetic region 430 is generated again. Therefore, the motion of the domain wall can be reliably stopped in the region 411L of the ferromagnetic material layer 411 having the large cross-sectional area.

EXAMPLE 5

Example 5 is also a modification of Example 1. Example 5 relates to the fourth information storage element and the fourth method of writing and reading information. In Example 5, a variation of an increase in the temperature of a ferromagnetic material layer (ferromagnetic recording layer) is generated in a direction of the axis of the ferromagnetic material layer (item [A] described above).

Figure 13A:
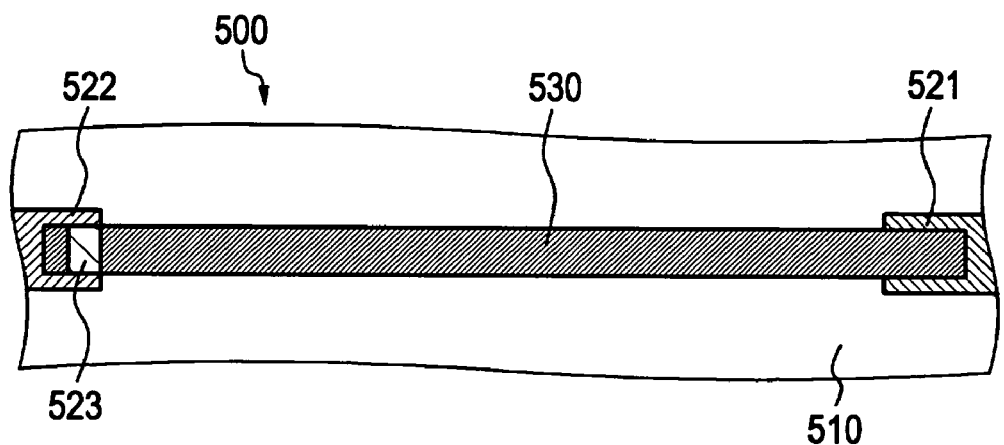
FIG. 13A is a schematic partial plan view of an information storage element of Example 5.
Figure 13B:
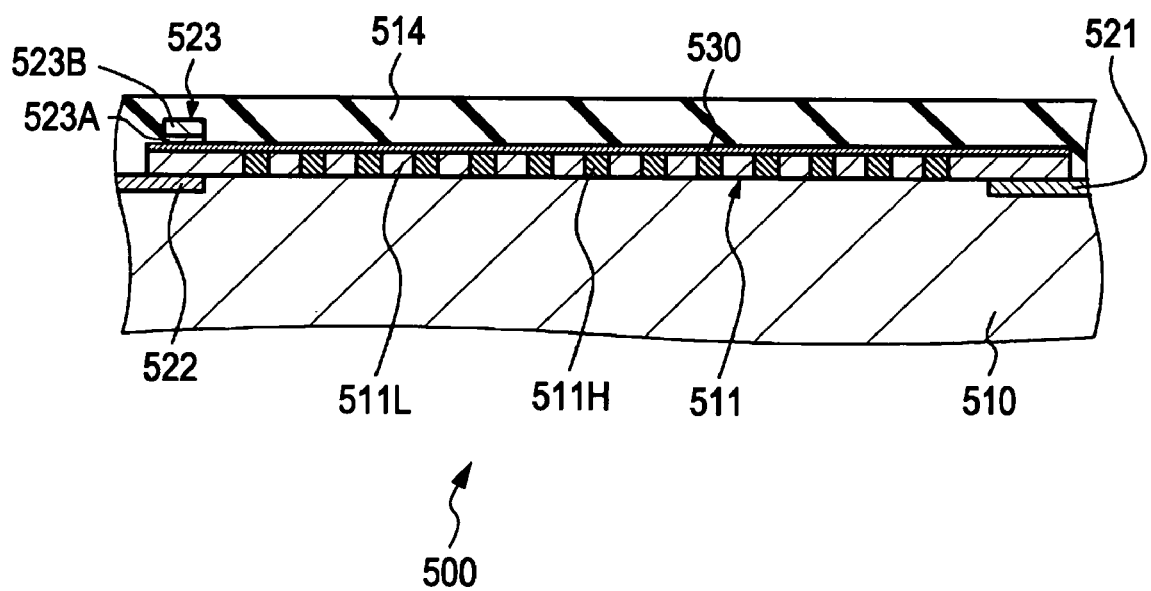
FIG. 13B is a schematic partial cross-sectional view of the information storage element of Example 5.

FIG. 13A is a schematic partial plan view of an information storage element of Example 5, and FIG. 13B is a schematic partial cross-sectional view of the information storage element. As shown in FIGS. 13A and 13B, in Example 5, a specific resistance value of a ferromagnetic material layer 511 varies in a direction of the axis of the ferromagnetic material layer 511. More specifically, regions 511H of the ferromagnetic material layer 511 having a high specific resistance value and regions 511L of the ferromagnetic material layer 511 having a low specific resistance value are alternately provided in the direction of the axis of the ferromagnetic material layer 511. In FIG. 13A, an interlayer insulating layer 514 is omitted. In FIG. 13B, the regions 511H having the high specific resistance value are shown by the areas hatched from top left to bottom right. When the number of bits of information to be stored is represented by N, the number of regions 511L of the ferromagnetic material layer 511 having the low specific resistance value is N or more (N in Example 5 and specifically N=16). The regions of the ferromagnetic material layer 511 having different specific resistance values are divided into two groups. By varying the specific resistance value of the ferromagnetic material layer 511 in the direction of the axis of the ferromagnetic material layer 511 as described above, when a domain wall-moving current is applied to the ferromagnetic material layer 511, a variation of an increase in the temperature of the ferromagnetic material layer (ferromagnetic recording layer) 511 can be generated in the direction of the axis of the ferromagnetic material layer 511. The regions 511H of the ferromagnetic material layer 511 having a high specific resistance value and regions 511L of the ferromagnetic material layer 511 having a low specific resistance value can be formed by implanting nitrogen ions or oxygen ions in the ferromagnetic material layer 511.

In Example 5, an antiferromagnetic region 530 is provided so as to cover the entire surface of the ferromagnetic material layer 511.

In Example 5, when a domain wall-moving current is supplied from a first electrode 521 to a second electrode 522 or a domain wall-moving current is supplied from the second electrode 522 to the first electrode 521, Joule heat is generated inside the ferromagnetic material layer 511, and the temperatures of the ferromagnetic material layer 511 and the antiferromagnetic region 530 are increased by the generated Joule heat. Here, the increase in the temperature $\Delta T_L$ in a region 511L of the ferromagnetic material layer 511 having a low specific resistance value is smaller than the increase in the temperature $\Delta T_H$ in a region 511H of the ferromagnetic material layer 511 having a high specific resistance value. Accordingly, in the region 511H of the ferromagnetic material layer 511 having a high specific resistance value, elimination or a decrease in exchange coupling between the ferromagnetic material layer 511 and the antiferromagnetic region 530 reliably occurs as compared with the region 511L of the ferromagnetic material layer 511 having the low specific resistance value. Here, a domain wall located in a region 511L of the ferromagnetic material layer 511 having a low specific resistance value before the start of a motion starts to move when a domain wall-moving current is applied. The domain wall then rapidly passes through a region 511H of the ferromagnetic material layer 511 having a high specific resistance value. When the supply of the domain wall-moving current is stopped or the value of the domain wall-moving current is decreased while the domain wall passes through the region 511H of the ferromagnetic material layer 511 having the high specific resistance value or at the time of the completion of the passage, the temperature of the region 511L of the ferromagnetic material layer 511 having the low specific resistance value immediately decreases, and exchange coupling between the ferromagnetic material layer 511 and the antiferromagnetic region 530 is generated again. Therefore, the motion of the domain wall can be reliably stopped in the region 511L of the ferromagnetic material layer 511 having the low specific resistance value.

EXAMPLE 6

Example 6 is also a modification of Example 1. Example 6 relates to the fifth information storage element of and the fifth method of writing and reading information. In Example 6, a variation of an increase in the temperature of a ferromagnetic material layer (ferromagnetic recording layer) is generated in a direction of the axis of the ferromagnetic material layer (item [A] described above).

In Example 6, a temperature control device 640 configured to change the temperature of a ferromagnetic material layer 611 in a direction of the axis of the ferromagnetic material layer 611 is disposed near the ferromagnetic material layer 611. By providing the temperature control device 640 in this manner, a variation of an increase in the temperature of the ferromagnetic material layer (ferromagnetic recording layer) 611 can be generated in the direction of the axis of the ferromagnetic material layer 611.

Figure 14:
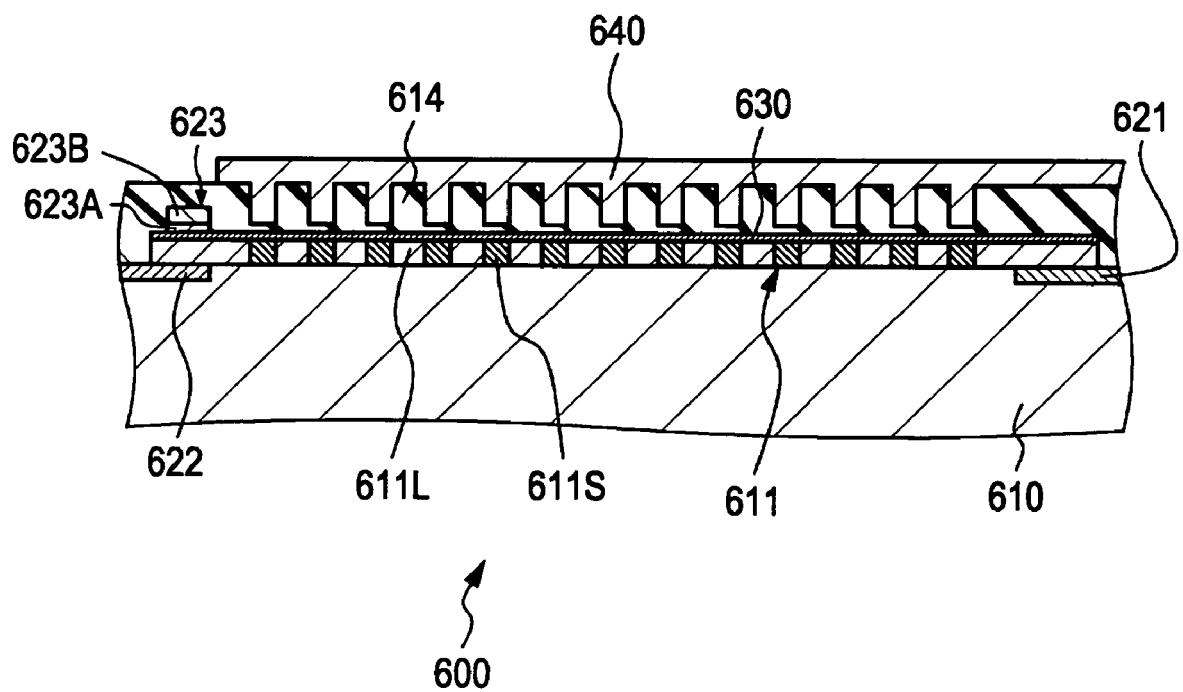
FIG. 14 is a schematic partial cross-sectional view of an information storage element of Example 6.

FIG. 14 is a schematic partial cross-sectional view of an information storage element of Example 6. As shown in FIG. 14, in Example 6, the temperature control device 640 is composed of a heat sink for changing the thermal conductivity of a region surrounding the ferromagnetic material layer 611. More specifically, an interlayer insulating layer 614 is provided on an antiferromagnetic region 630 covering the ferromagnetic material layer 611. Recesses are provided in portions of the interlayer insulating layer 614, the portions being disposed on upper portions of the ferromagnetic material layer 611. The temperature control device 640 having a strip shape and composed of a copper (Cu) layer is provided on the interlayer insulating layer 614 including the recesses so as to be parallel to the ferromagnetic material layer 611. The distance from the bottom face of the temperature control device 640 to the antiferromagnetic region 630 in each portion (region) 611L of the ferromagnetic material layer 611 is longer than the distance from the bottom face of the temperature control device 640 to the antiferromagnetic region 630 in each portion (region) 611S of the ferromagnetic material layer 611. The temperature of the ferromagnetic material layer 611 is changed in the direction of the axis of the ferromagnetic material layer 611 in this manner. The regions of the ferromagnetic material layer 611 having different temperatures are divided into two groups. In FIG. 14, the regions 611S are shown by the areas hatched from top left to bottom right.

Similarly, in Example 6, when a domain wall-moving current is supplied from a first electrode 621 to a second electrode 622 or a domain wall-moving current is supplied from the second electrode 622 to the first electrode 621, Joule heat is generated inside the ferromagnetic material layer 611, and the temperatures of the ferromagnetic material layer 611 and the antiferromagnetic region 630 are increased by the generated Joule heat. Here, the increase in the temperature $\Delta T_S$ in a region 611S of the ferromagnetic material layer 611 is smaller than the increase in the temperature $\Delta T_L$ in a region 611L of the ferromagnetic material layer 611. Accordingly, in the region 611L of the ferromagnetic material layer 611, elimination or a decrease in exchange coupling between the ferromagnetic material layer 611 and the antiferromagnetic region 630 reliably occurs as compared with the region 611S of the ferromagnetic material layer 611. Here, a domain wall located in the region 611S of the ferromagnetic material layer 611 before the start of a motion starts to move when a domain wall-moving current is applied. The domain wall then rapidly passes through the region 611L of the ferromagnetic material layer 611. When the supply of the domain wall-moving current is stopped or the value of the domain wall-moving current is decreased while the domain wall passes through the region 611L of the ferromagnetic material layer 611 or at the time of the completion of the passage, the temperature of the region 611S of the ferromagnetic material layer 611 immediately decreases, and exchange coupling between the ferromagnetic material layer 611 and the antiferromagnetic region 630 is generated again. Therefore, the motion of the domain wall can be reliably stopped in the region 611S of the ferromagnetic material layer 611. Instead of a heat sink, a heater may be provided as the temperature control device 640.

The present invention has been described on the basis of preferred Examples, but the present invention is not limited to these Examples. The configurations, the structures, the materials, and the production methods of the information storage elements described in Examples are illustrative only, and can be appropriately changed. Alternatively, as a method of writing information into and reading information from a ferromagnetic material layer (ferromagnetic recording layer), a method may be employed in which information is written on the basis of a magnetic field generated by a current and the information is read by detecting a direction of the magnetic field in the ferromagnetic material layer. In such a case, specific examples of a magnetic field generation/detection device include a coil and wiring that generate a magnetic field.

Figure 15:
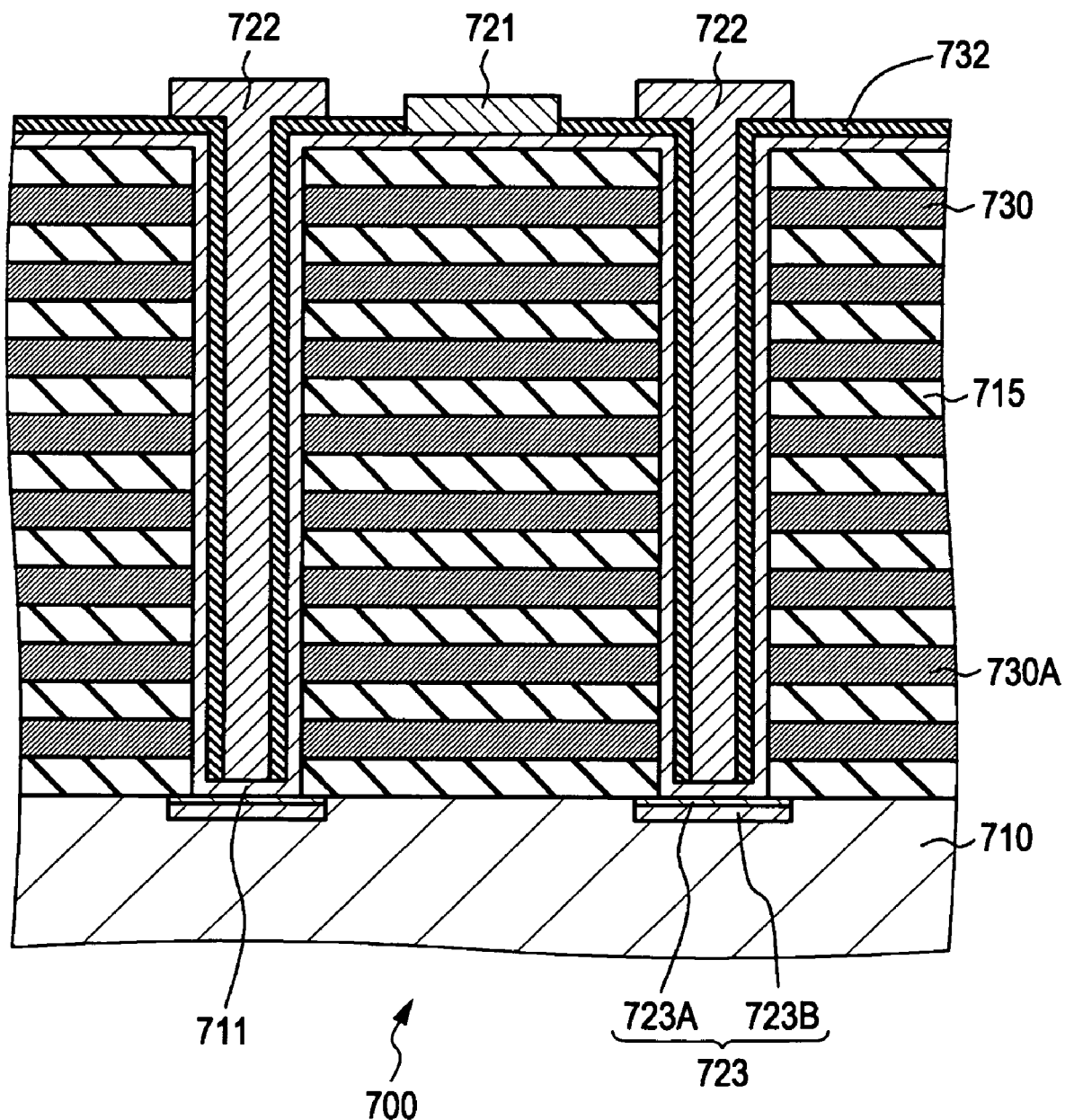
FIG. 15 is a schematic partial cross-sectional view of a modification of the information storage element of Example 1.

FIG. 15 is a schematic partial cross-sectional view of a modification of the information storage element of Example 1. As shown in FIG. 15, a strip-shaped ferromagnetic material layer (ferromagnetic recording layer) 711 in an information storage element 700 may be, for example, a U-shaped three-dimensional layer. This information storage element 700 can be produced by, for example, the following method. Specifically, third electrodes 723 each having a stacked structure including a non-magnetic film 723A and a magnetization reference layer 723B are formed in a substrate 710 composed of a silicon semiconductor substrate. Subsequently, a stacked structure in which interlayer insulating layers 715 and antiferromagnetic material layers 730A are stacked is formed on the substrate 710. Next, openings are formed in the stacked structure located on the third electrodes 723. A ferromagnetic material layer 711 is formed in the openings, and an insulating film 732 is then formed on the ferromagnetic material layer 711. Subsequently, parts of the insulating film 732 located on the bottom of each of the openings and on the top face of the stacked structure are removed. Subsequently, each of the openings is filled with a second electrode 722, and a first electrode 721 is formed on the ferromagnetic material layer 711 exposed on the top face of the stacked structure.

The present application contains subject matter related to that disclosed in Japanese Priority Patent Application JP 2008-267222 filed in the Japan Patent Office on Oct. 16, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of writing information into and reading information from an information storage element which includes a strip-shaped ferromagnetic material layer, a first electrode disposed at an end of the ferromagnetic material layer, a second electrode disposed at another end of the ferromagnetic material layer, and an antiferromagnetic region composed of an antiferromagnetic material and disposed in contact with at least a part of the ferromagnetic material layer, the method comprising the steps of:

applying a current between the first electrode and the second electrode to cause a current-induced domain wall motion;

in the ferromagnetic material layer, writing a magnetization state into a magnetization region as information or reading a magnetization state from a magnetization region as information; and eliminating or decreasing exchange coupling between the ferromagnetic material layer and the antiferromagnetic region at the time of the motion of a domain wall.

2. The method according to claim 1, wherein the exchange coupling between the ferromagnetic material layer and the antiferromagnetic region is eliminated or decreased by Joule heat generated by applying the current between the first electrode and the second electrode.

3. The method according to claim 2,
wherein a plurality of antiferromagnetic regions are arranged with a space therebetween, and
when the number of bits of information to be stored is represented by N, the number of antiferromagnetic regions is N or more.

4. The method according to claim 2,
wherein a plurality of antiferromagnetic regions are arranged,
an upper limit temperature at which the magnetization state in the magnetization region can be fixed varies between the antiferromagnetic regions, and
when the number of bits of information to be stored is represented by N, the number of antiferromagnetic regions having a high upper-limit temperature is N or more.

5. The method according to claim 2,
wherein regions of the ferromagnetic material layer having a large cross-sectional area and regions of the ferromagnetic material layer having a small cross-sectional area, the cross-sectional areas being obtained when the ferromagnetic material layer is cut along a virtual plane orthogonal to a direction of the axis of the ferromagnetic material layer, are alternately provided in the direction of the axis of the ferromagnetic material layer, and
when the number of bits of information to be stored is represented by N, the number of regions of the ferromagnetic material layer having the large cross-sectional area is N or more.

6. The method according to claim 2,
wherein regions of the ferromagnetic material layer having a high specific resistance value and regions of the ferromagnetic material layer having a low specific resistance value are alternately provided in a direction of the axis of the ferromagnetic material layer, and
when the number of bits of information to be stored is represented by N, the number of regions of the ferromagnetic material layer having the low specific resistance value is N or more.

7. The method according to claim 1, wherein the information storage element further includes temperature control means for changing the temperature of the ferromagnetic material layer in a direction of the axis of the ferromagnetic material layer, the temperature control means being disposed near the ferromagnetic material layer.

8. The method according to claim 1,
wherein the information storage element further includes a third electrode disposed in contact with a part of the ferromagnetic material layer, the third electrode including a non-magnetic film that is in contact with the part of the ferromagnetic material layer and a magnetization reference layer disposed on the non-magnetic film, and
a magnetization state is written into each magnetization region as information by applying a current between the second electrode and the third electrode.

9. The method according to claim 8, wherein an electrical resistance value in each magnetization region is read from the third electrode as information by applying a current between the second electrode and the third electrode.

10. The method according to claim 1, wherein the current applied to the ferromagnetic material layer in order to cause a current-induced domain wall motion is regularly modulated.

11. An information storage element comprising:
a strip-shaped ferromagnetic material layer;
a first electrode disposed at an end of the ferromagnetic material layer;
a second electrode disposed at another end of the ferromagnetic material layer; and
an antiferromagnetic region composed of an antiferromagnetic material and disposed in contact with at least a part of the ferromagnetic material layer,
wherein a current-induced domain wall motion is caused by applying a current between the first electrode and the second electrode,
in the ferromagnetic material layer, a magnetization state is written into a magnetization region as information or a magnetization state is read from a magnetization region as information, and
exchange coupling between the ferromagnetic material layer and the antiferromagnetic region at the time of the motion of a domain wall is eliminated or decreased.

12. The information storage element according to claim 11, further comprising:
a third electrode disposed in contact with a part of the ferromagnetic material layer, the third electrode including a non-magnetic film that is in contact with the part of the ferromagnetic material layer and a magnetization reference layer disposed on the non-magnetic film,
wherein a magnetization state is written into each magnetization region as information by applying a current between the second electrode and the third electrode.

13. The information storage element according to claim 12, wherein an electrical resistance value in each magnetization region is read from the third electrode as information by applying a current between the second electrode and the third electrode.

14. The information storage element according to claim 11, wherein a plurality of antiferromagnetic regions are arranged with a space therebetween, and when the number of bits of information to be stored is represented by N, the number of antiferromagnetic regions is N or more.

15. The information storage element according to claim 11, wherein a plurality of antiferromagnetic regions are arranged,
an upper limit temperature at which the magnetization state in the magnetization region can be fixed varies between the antiferromagnetic regions, and
when the number of bits of information to be stored is represented by N, the number of antiferromagnetic regions having a high upper-limit temperature is N or more.

16. The information storage element according to claim 11, wherein regions of the ferromagnetic material layer having a large cross-sectional area and regions of the ferromagnetic material layer having a small cross-sectional area, the cross-sectional areas being obtained when the ferromagnetic material layer is cut along a virtual plane orthogonal to a direction of the axis of the ferromagnetic material layer, are alternately provided in the direction of the axis of the ferromagnetic material layer, and
when the number of bits of information to be stored is represented by N, the number of regions of the ferromagnetic material layer having the large cross-sectional area is N or more.

17. The information storage element according to claim 11, wherein regions of the ferromagnetic material layer having a high specific resistance value and regions of the ferromagnetic material layer having a low specific resistance value are alternately provided in a direction of the axis of the ferromagnetic material layer, and
when the number of bits of information to be stored is represented by N, the number of regions of the ferromagnetic material layer having the low specific resistance value is N or more.

18. The information storage element according to claim 11, further comprising:
temperature control means for changing the temperature of the ferromagnetic material layer in a direction of the axis of the ferromagnetic material layer, the temperature control means being disposed near the ferromagnetic material layer.

* * * * *